(12) United States Patent
Hano

(10) Patent No.: US 6,825,700 B2
(45) Date of Patent: Nov. 30, 2004

(54) SEMICONDUCTOR DEVICE

(75) Inventor: Mitsutaka Hano, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 57 days.

(21) Appl. No.: 10/425,620

(22) Filed: Apr. 30, 2003

(65) Prior Publication Data

US 2003/0218186 A1 Nov. 27, 2003

(30) Foreign Application Priority Data

May 24, 2002 (JP) ........................................ 2002-151106
Feb. 18, 2003 (JP) ........................................ 2003-039885

(51) Int. Cl.[7] ............................................. H03K 3/00
(52) U.S. Cl. ....................................... 327/108; 327/390
(58) Field of Search ............................... 327/108–112, 390, 327/589

(56) References Cited

U.S. PATENT DOCUMENTS 6,353,345 B1 * 3/2002 Yushan et al. ............... 327/112

6,507,085 B2  1/2003 Shimizu

FOREIGN PATENT DOCUMENTS

| EP | 0 743 752 A1 | 11/1996 |
| EP | 0 649 579 B1 | 8/1998 |
| EP | 0 719 475 B1 | 3/1999 |
| JP | 7-508873 | 9/1995 |
| JP | 9-65571 | 3/1997 |
| JP | 9-503116 | 3/1997 |

* cited by examiner

*Primary Examiner*—Kenneth B. Wells
(74) *Attorney, Agent, or Firm*—Oblon, Spivak, McClelland, Maier & Neustadt, P.C.

(57) ABSTRACT

A bootstrap circuit includes at least a chargeable semiconductor element region (D3, 6) and a drift region (Rn, 8) of a high-tension island, and junction between the chargeable semiconductor element region and the high-tension island drift region is isolated, and the high-tension island drift region has n+ layers (11, 12) provided at a high-tension side and at an opening portion in an n− semiconductor layer (106) of a high-tension island, and thus an ON operation of a parasitic transistor can be prevented to thereby reduce a current consumption of the circuits.

17 Claims, 28 Drawing Sheets ical SEMICONDUCTOR DEVICE

BACKGROUND OF THE INVENTION

1. Field of the Invention

The present invention relates to a semiconductor device for driving a power device and, more particularly, to a semiconductor device of an integrated circuit MOS structure with high-tension resistance which drives a power device such as an inverter and prevents an on operation of a parasitic transistor, using a bootstrap circuit system.

2. Description of the Prior Art

In a conventional bootstrap diode system, although a bootstrap diode is generally provided outside an IC chip having a high-tension resistance (referred to as "high-tension resistance IC chip" or simply "IC chip", hereinafter), there has been developed a bootstrap diode system in which the bootstrap diode is mounted on the high-tension resistance IC chip for the purpose of achieving a single chip structure.

The high-tension resistance IC chip of a conventional bootstrap circuit system is described with reference to FIGS. 27 and 28. FIG. 27 is a sectional view showing a conventional bootstrap diode and FIG. 28 is a conventional schematic circuit structure in which a power device (e.g., power converter) is connected to the high-tension resistance IC chip having the bootstrap diode shown in FIG. 27 mounted thereon.

The bootstrap system shown in FIG. 27 includes a bootstrap diode portion 101 and a CMOS region 102 for driving a high-tension side which are mounted on a high-tension resistance IC chip. An n− semiconductor layer 106 is formed on a p− substrate 105, and a p− well 103 and a p+ type diffusion layer 104 of an interlayer insulating film are provided apart from each other in the n− semiconductor layer 106.

Thus, a power-supply voltage Vcc can be applied between the p− well 103 and the p+ type diffusion layer 104 and a high-tension diode can be used as a bootstrap diode (D101). In addition, the p− substrate 105 on the high-tension resistance IC chip is connected to a ground potential (GND) in general.

Referring to FIG. 28, C1 designates an external bootstrap capacitor (referred to as "an external capacitor" hereinafter). An upper (high-tension side) power transistor T1 and a lower (low-tension side) power transistor T2 are connected in series between a high-voltage terminal HV and the ground GND, and the transistors T1 and T2 have peculiar substrate diodes D1 and D2, respectively.

As shown in the figure, the high-tension resistance IC includes a high-tension side drive circuit 111, a low-tension side drive circuit 112, a level shit circuit 113, a delay circuit 114 and a bootstrap diode D101 with a high-tension resistance and the high-tension resistance IC is connected to a power device constituted by the transistors T1 and T2 and the like so that the power device is driven.

One terminal of the external capacitor C1 is connected to a power-supply voltage Vcc through the bootstrap diode D101 on the IC chip. When an output terminal OUT is maintained approximately at a ground potential under the condition that the lower transistor T2 is in a conducting (ON) state, a charging current is applied to the external capacitor C1 and the external capacitor C1 stores a charged voltage V1 which is slightly lower than the power-supply voltage Vcc by a voltage drop. Thus, the low-tension side drive circuit 112 is driven by the relatively low power-supply voltage Vcc and the high-tension side drive circuit 111 is driven by the voltage V1 charged in the external capacitor C1.

As described above, according to the high-tension resistance IC chip shown in FIGS. 27 and 28, an anode 107 of the bootstrap diode D101 is connected to the power-supply voltage Vcc through a limiting resistance R1, a cathode 108 thereof is connected to a floating supply absolute voltage terminal VB on the high-tension side. The external capacitor C1 is connected between the floating supply absolute voltage terminal VB on the high-tension side and a floating supply offset voltage terminal VS (i.e., output terminal OUT) on the high-tension side.

In this structure, when the transistor T2 on the low-tension side, which is an output element of a power converter, turns on, the external capacitor C1 is charged through the high-tension bootstrap diode D101, and the drive circuit 111 on the high-tension side is driven by the voltage V1 charged in the external capacitor C1. Thus, there is provided a system in which it is not necessary to additionally provide a floating power supply on the high-tension side.

As another example of a conventional structure, a charging circuit of bootstrap capacitance is disclosed in the Japanese Patent Laid-Open No.9-65571 (1997) gazette (cf. paragraphs [0009] to [0014], FIGS. 3 to 5) (referring to as a patent document 1), in which a device for preventing an ON operation of a parasitic transistor of an integrated LDMOS structure during transition is provided, and an integrated LDMOS transistor which guarantees prevention of integrated device breakdown is employed and timing of a lower power element is synchronized with that of the LDMOS.

However, in the bootstrap circuit system having the bootstrap diode D101 mounted on the high-tension resistance IC as shown in FIGS. 27 and 28, a RESURF structure is provided in order to keep a high voltage of a potential of the anode 107 of the diode D101 which is higher than that of the p− substrate 105 by the power-supply voltage. In this case, when the power-supply voltage Vcc is applied, a parasitic PNP transistor 109 turns on and a current amplification factor $H_{FE}$ of the parasitic PNP transistor becomes large because of a low base ion concentration thereof, resulting in a problem that a very large current flows from the anode 107 toward the p− substrate 105 through the p− well 103 and the n− semiconductor layer 106.

SUMMARY OF THE INVENTION

The present invention has been made to solve the above problems, and has an object to provide a semiconductor device on an IC chip with a high-tension resistance by employing a bootstrap system in which a parasitic transistor is prevented from turning on and a current consumption of a circuit can be reduced.

More specifically, it is a main object of the present invention to prevent the operation of the parasitic PNP transistor as much as possible by performing roles of high-tension maintaining and charging operations by different elements of which junction is isolated. This is because the high-tension maintaining part is of the n− drift layer although it is of the RESURF structure, and therefore the parasitic PNP transistor is not generated.

In addition, as the semiconductor element for charging, roughly two types such as a diode type and a pch-MOS transistor type are mounted, and in order to prevent the operation of the parasitic PNP transistor as much as possible in either type, a base ion concentration is increased by adding a buried n+ layer so that a current amplification factor $H_{FE}$ of the parasitic PNP transistor is reduced.

In order to attain the above object, the present invention provides a semiconductor device for driving a power device. The semiconductor device is comprised of a bootstrap circuit which drives a power element on a low-tension side of the power device and supplies a power supply voltage for a high-tension drive side to a bootstrap capacitor connected between a floating supply absolute voltage terminal of the high-tension drive side and a floating supply offset voltage terminal of the high-tension drive side.

The bootstrap circuit includes at least a chargeable semiconductor element region and a high-tension maintaining potion, wherein junction between the chargeable semiconductor element portion and the high-tension maintaining portion is isolated. The high-tension maintaining portion is comprised of an n– drift layer having n+ layers provided at a high-tension side and at an opening portion in an n– semiconductor layer of a high-tension island. In addition, a pair of p+ layers whose potential is the same as in the p– substrate is provided on both sides of the n+ layer of the high-tension island opening portion.

BRIEF DESCRIPTION OF THE DRAWINGS

These and other objects and features of the present invention will be readily understood from the following detailed description taken in conjunction with preferred embodiments thereof with reference to the accompanying drawings, in which.

DETAILED DESCRIPTION OF THE PREFERRED EMBODIMENTS

Figure 1:
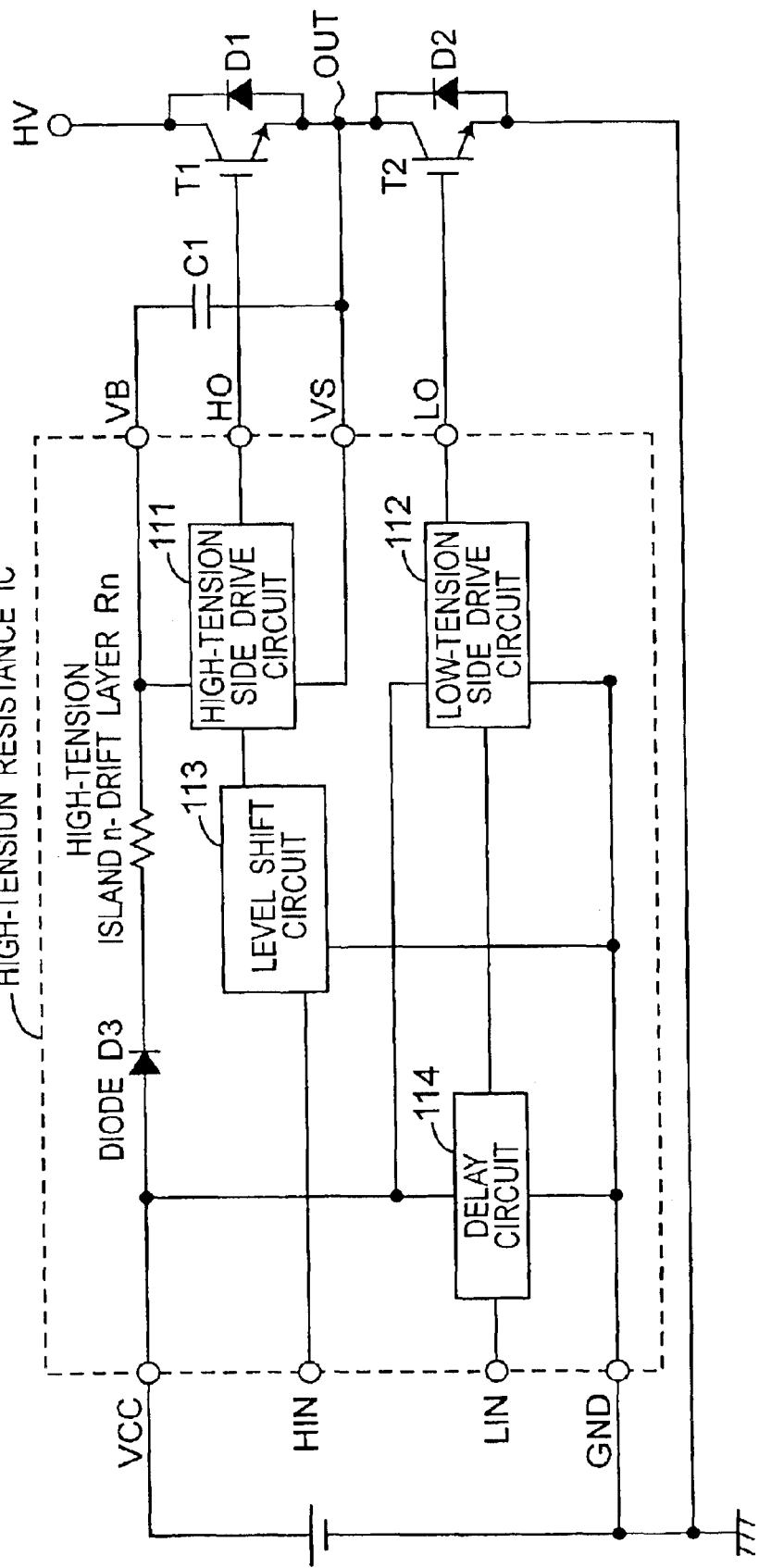
FIG. 1 is a schematic circuit view showing a structure of a semiconductor device connected with a power device according to Embodiment 1 of the present invention.

Before the description proceeds, it is to be noted that, Embodiments according to the present invention are described hereinafter with reference to FIGS. 1 to 26 by way of illustration of a bootstrap system in which a chargeable semiconductor element portion and an n– drift layer for maintaining a high tension with their junction isolated are mounted on a monolithic IC chip with a high-tension resistance, i.e., high-tension resistance IC chip of a single-chip structure.

However, the present invention is not limited to this and it can be applicable for a semiconductor device provided with another MOS transistor or the like. In addition, it is noted that the same reference numerals and characters are allotted to the common components throughout the drawings and descriptions which will overlap are omitted for brevity.

(Embodiment 1)

Figure 2:
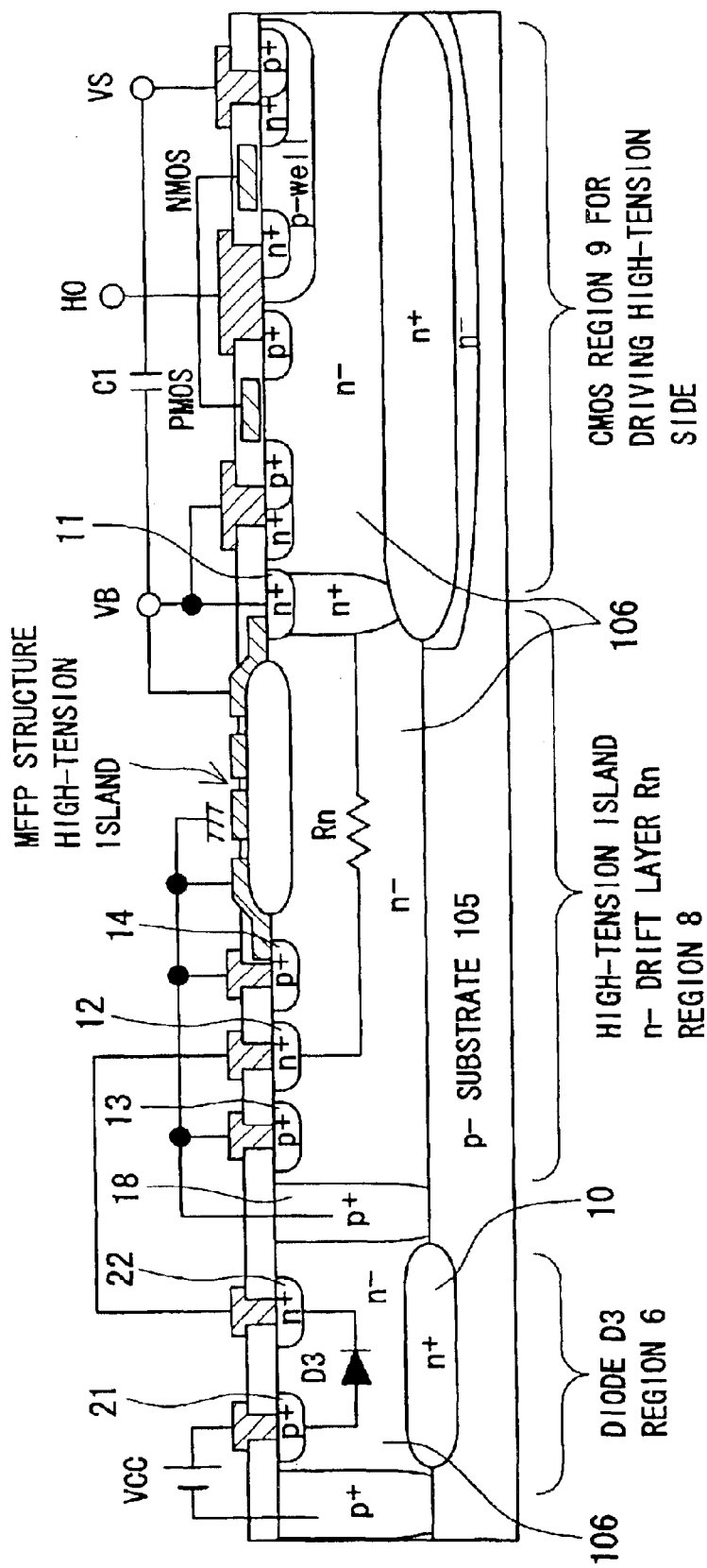
FIG. 2 is a sectional view showing an essential part of a bootstrap circuit of the semiconductor device according to Embodiment 1 of the present invention.

Embodiment 1 according to the present invention is described with reference to FIGS. 1 and 2. FIG. 1 shows a schematic circuit structure according to Embodiment 1 of the present invention, in which a semiconductor device and a power device are connected. FIG. 2 shows a sectional structure of an essential part of a bootstrap circuit according to Embodiment 1 of the present invention.

According to a structure of a bootstrap system shown in FIGS. 1 and 2, a diode D3 region 6 and an n– drift layer Rn region 8 using a high-tension island are mounted on a monolithic IC chip having a high-tension resistance. In this system, the n– drift layer Rn is provided for maintaining a high voltage in such a manner that the n– drift layer Rn is connected between a cathode terminal 22 of a diode D3 and a floating supply absolute voltage VB terminal 11 of a high-tension side drive circuit 111.

Upper (high-tension side) and lower (low-tension side) power transistors T1 and T2 operate in a switching mode for a repeating cycle of a predetermined high frequency and each transistor turns on during each of two different phases for one cycle. A diode D1 peculiar to the upper transistor T1 limits a positive transient voltage which is generated at an output terminal OUT when the lower transistor T2 turns off, and a diode D2 peculiar to the lower transistor T2 limits a negative transient voltage which is generated at the output terminal OUT when the upper transistor T1 turns off.

The high-tension side drive circuit 111 responds to a predetermined command signal for driving the upper transistor which is applied from an input terminal HIN on the high-tension side through a level shift circuit 113 and turns on the upper transistor T1 during a specific phase period through an output terminal HO on the high-tension side.

Similarly, a low-tension side drive circuit 112 responds to a predetermined command signal for driving the lower transistor which is applied from an input terminal LIN on the low-tension side through a delay circuit 114 and turns on the lower transistor T2 during a specific phase period through an output terminal LO on the low-tension side. In this arrangement, one terminal of each of the drive circuit 112, the level shift circuit 113 and the delay circuit 114 is connected to a ground potential GND.

Meanwhile, one terminal of an external capacitor C1 which is connected between a VB terminal and a VS terminal is connected to a power-supply voltage Vcc (of, for example, 15V) through the n– drift layer Rn and through the diode D3 region 6 on the monolithic IC chip. A charging current is applied to the external capacitor C1 in the case where the output terminal OUT is maintained approximately at the ground potential under the condition that the lower transistor T2 is in a conducting (ON) state and the external capacitor C1 maintains a charging voltage V1 which is slightly lower than the power-supply voltage Vcc by a voltage drop (VF).

Thus, the low-tension side drive circuit 112 is driven by the relatively low power-supply voltage Vcc and the high-tension side drive circuit 111 is driven by the voltage V1 charged in the external capacitor C1.

In this way, in the monolithic IC with a high-tension resistance shown in FIGS. 1 and 2, an anode p+ layer 21 in the diode D3 region 6 is connected to the power-supply voltage Vcc and a cathode n+ layer 22 in the diode D3 region 6 is connected to the n– drift layer Rn, and a current is applied to the external capacitor C1 through the n– drift layer Rn so that the external capacitor C1 is charged as the voltage V1. Thus, by using the voltage V1 charged in the external capacitor C1 as a power-supply voltage for the high-tension side drive circuit 111, it is not necessary to additionally provide a floating power supply on the high-tension side in the bootstrap system.

In this arrangement, the sectional structure of the bootstrap circuit shown in FIG. 2 includes the diode D3 region 6, an n– drift layer region 8 of a high-tension island and a CMOS transistor region 9 for driving of the high-tension side, and a buried n+ layer 10 is intervened between an n– semiconductor layer 106 and a p– substrate 105 in the diode D3 region 6.

Meanwhile, in the n– drift layer region 8 of the high-tension island, p+ layers 13 and 14 having the same potential as that of the p– substrate 105 are provided to enlarge a depletion layer to reduce an electric field concentration of an n+ region 12. In addition, a p+ diffusion region 18 is formed in the n– semiconductor layer 106 as an interlayer insulating film in a depthwise as to reach the p– substrate 105, so that the p+ diffusion region 18 isolates the junction of the diode D3 region 6 and the n– drift layer region 8 of the high-tension island.

As can be apparent from the sectional structure of the thus-formed bootstrap circuit, the diode D3 region 6 includes the anode p+ layer 21 and the cathode n+ layer 22 in the n– semiconductor layer 106 therein and the buried n+ layer 10 is intervened between the n– semiconductor layer 106 and the p– substrate 105 in the diode D3 region 6.

Figure 27:
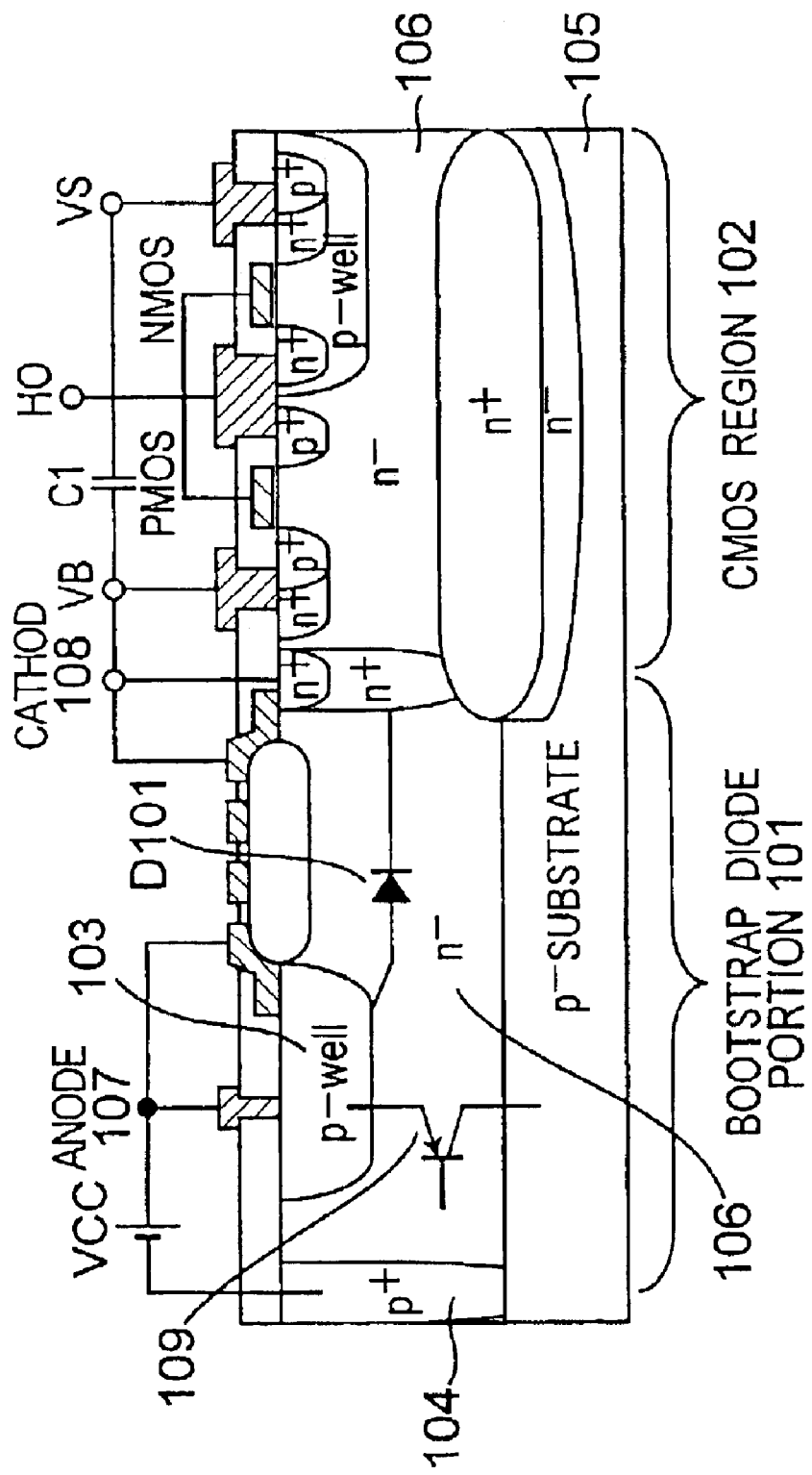
FIG. 27 is a sectional view showing an essential part of a bootstrap circuit of a conventional semiconductor device.
Figure 28:
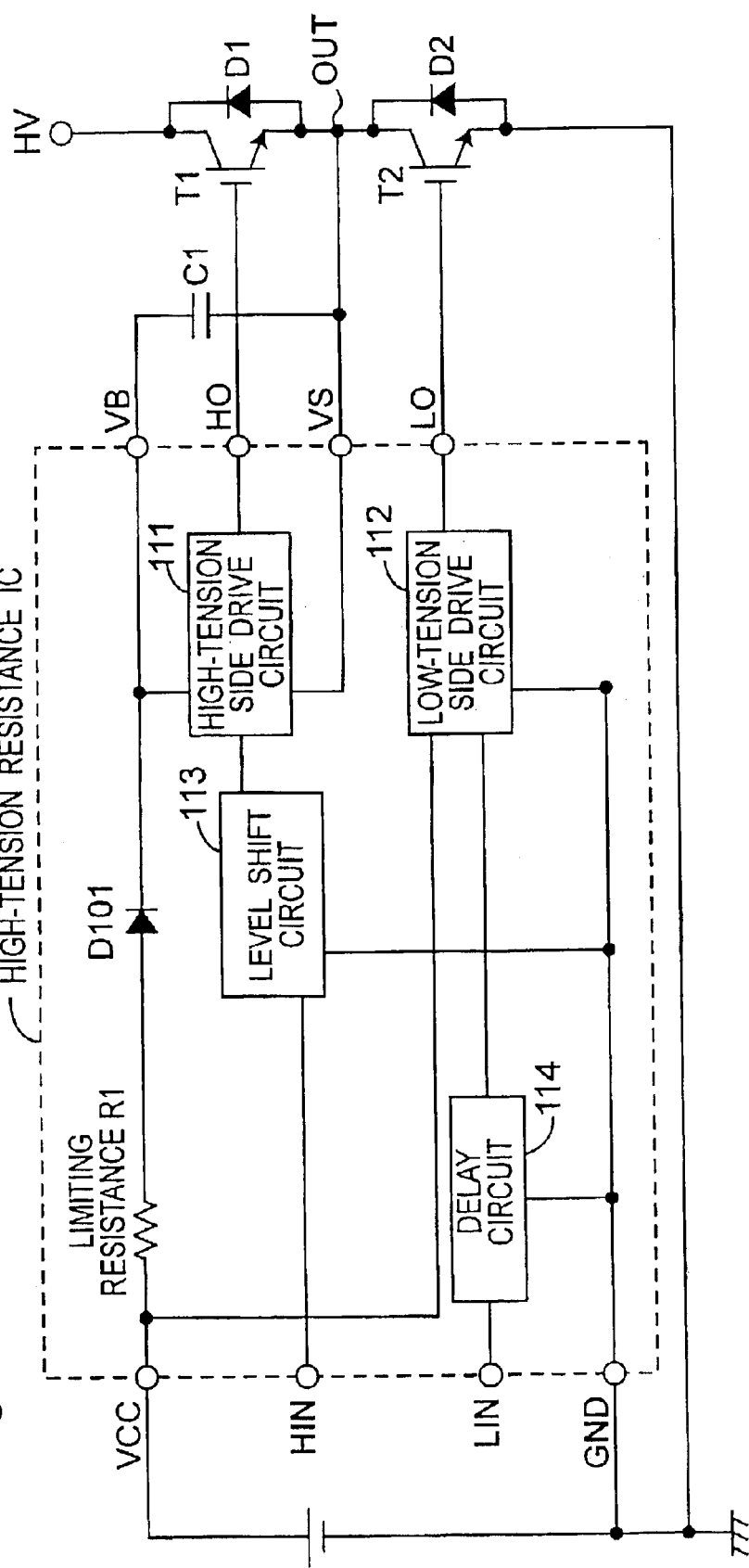
FIG. 28 is a schematic circuit view showing a structure of a conventional semiconductor device connected with a power device.

Thus, a base ion concentration is increased so that a current amplification factor $H_{FE}$ of a parasitic PNP transistor 109 shown in FIG. 27 in a conventional parasitic PNP transistor structure can be lowered and an ON operation of the parasitic PNP transistor can be prevented far better as compared with the conventional structure. As a result, a current is prevented from flowing from the anode p+ layer 21 toward the p– substrate 105 through the n– semiconductor layer 106 in the diode D3 region 6.

Meanwhile, the n– drift layer region 8 of the high-tension island has a structure in which multiple floating field plate (MFFP) is double buried. More specifically, the n– drift layer Rn region 8 of the high-tension island is provided between the n+ layer 11 on the high potential side and the n+ layer 12 of an opening portion in the n– semiconductor layer 106 in the high-tension island and the n+ layer 12 is surrounded by the pair of p+ layers 13 and 14 which is fixed at the same potential as that of the p-substrate (ground potential GND).

Thus, the depletion layer is enlarged and the electric field concentration of the n+ layer 12 of the opening portion can be reduced. Thus, when the power element on the high-tension side turns on while a power element on the low-tension side turns off, the potential of the n+ layer 12 of the opening portion becomes a floating potential, which can be controlled so as to be a low potential (about 40V or less) so that a high voltage, that is, 600V or more can be maintained.

As described above, in the bootstrap system of the embodiment 1 according to the present invention, since the diode D3 region 6 and the n– drift layer region 8 of the high-tension island are mounted on the high-tension resistance IC chip, current consumption of a circuit can be effectively reduced. In addition, as shown in FIG. 2, since the junction of the diode D3 region 6 and the n-drift layer Rn region 8 of the high-tension island is isolated, they can be mounted on the monolithic IC chip.

(Embodiment 2)

Figure 3:
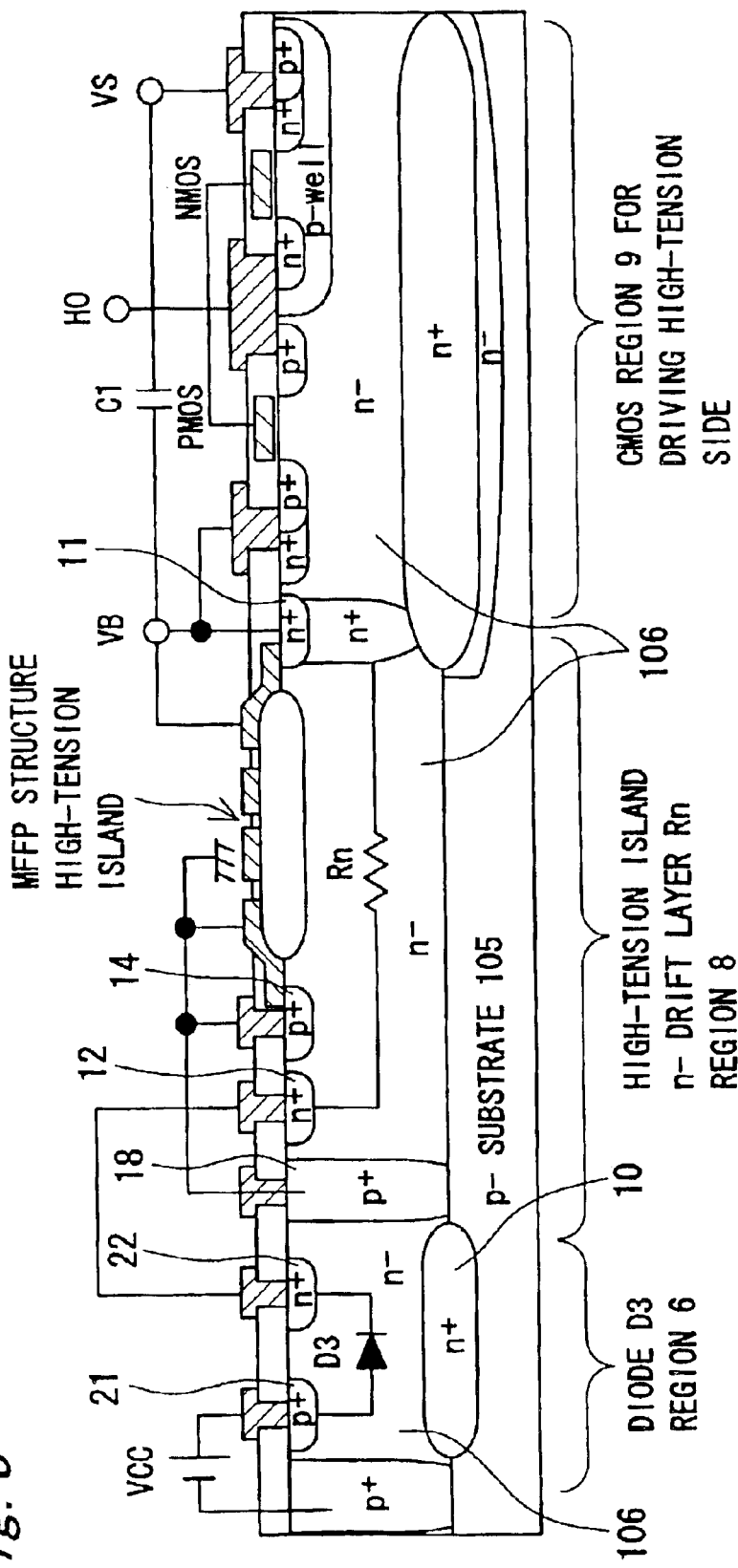
FIG. 3 is a sectional view showing an essential part of a bootstrap circuit of a semiconductor device according to Embodiment 2 of the present invention.

Embodiment 2 of the present invention is described with reference to FIG. 3. FIG. 3 shows a sectional structure of an essential part of a bootstrap circuit according to Embodiment 2 of the present invention and its basic structure is substantially the same as that of Embodiment 1 shown in FIGS. 1 and 2. Embodiment 2 is different from Embodiment 1 in that, whereas the pair of p+ layers 13 and 14 in n− drift layer Rn region 8 in Embodiment 1 shown in FIG. 2, the p+ layer 13 is omitted and only a p+ layer 14 is provided in Embodiment 2 shown in FIG. 3.

In the structure in which the p+ layer 13 is omitted, the p+ diffusion region 18 which isolates the junction of the diode D3 region 6 and the n− drift layer Rn region 8 of the high-tension island serves also as the p+ layer 13 to reduce the electric field concentration of the n+ layer 12. Therefore, since the p+ layer 13 is omitted, an area of the n− drift layer region 8 of the high-tension island in the IC chip can be reduced by an area just corresponding to the omitted p+ layer 13.

(Embodiment 3)

Figure 4:
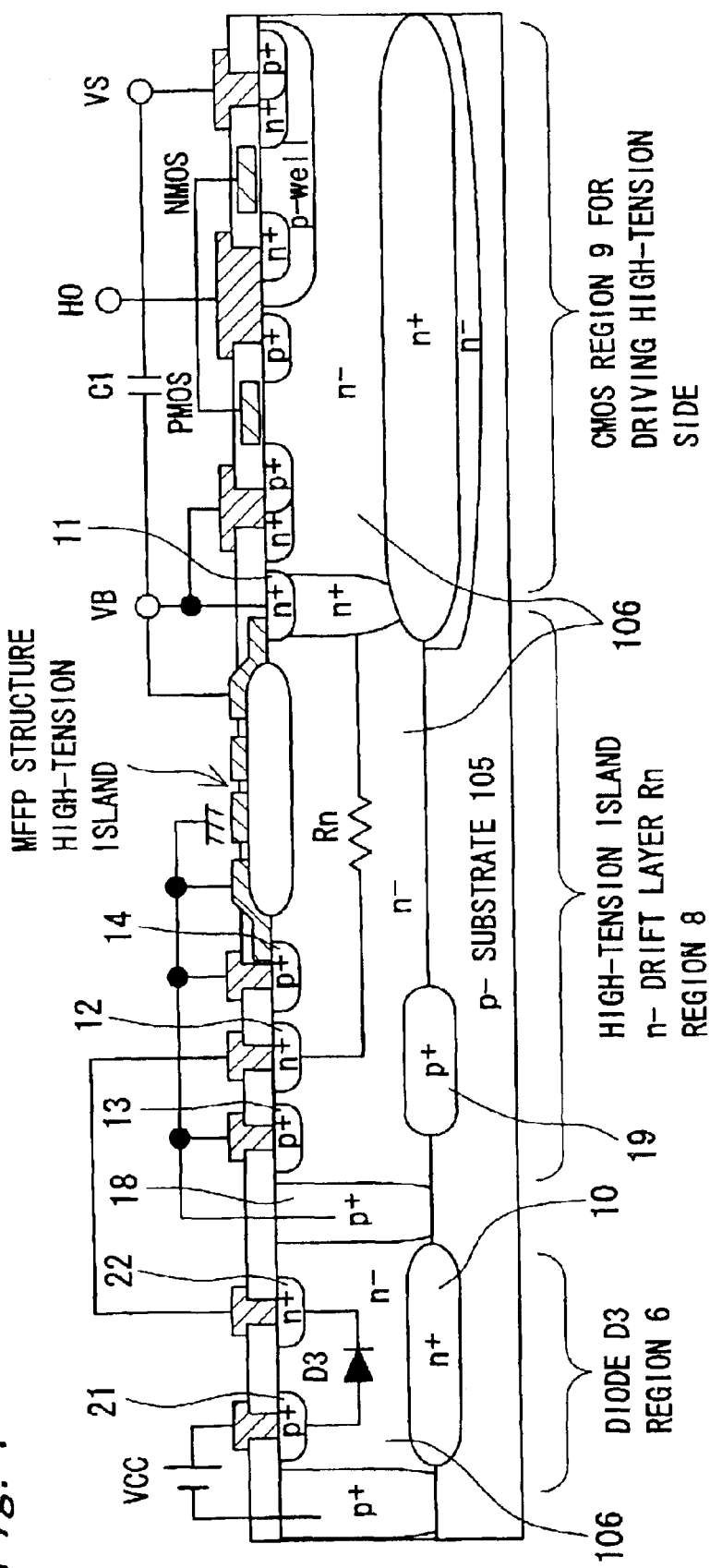
FIG. 4 is a sectional view showing an essential part of a bootstrap circuit of a semiconductor device according to Embodiment 3 of the present invention.
Figure 5:
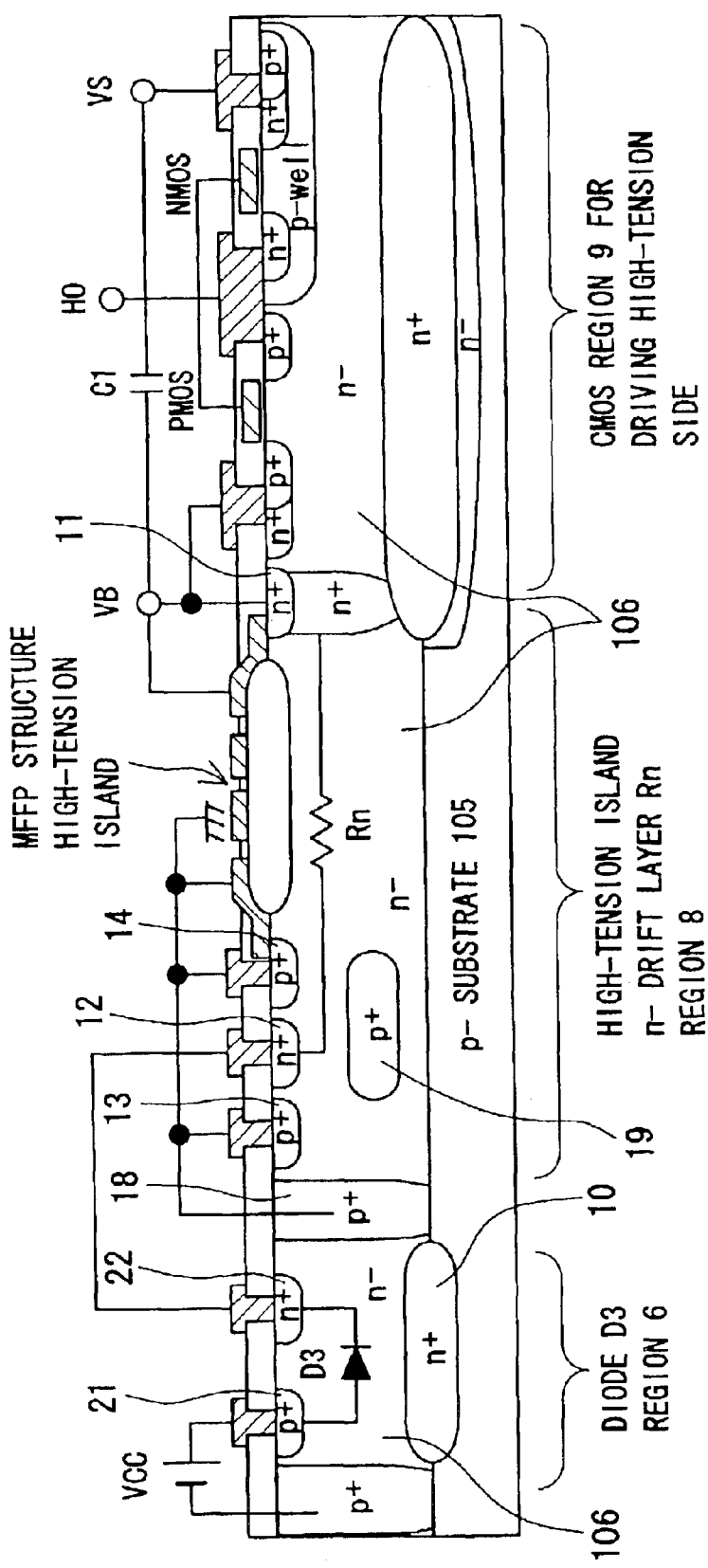
FIG. 5 is a sectional view showing an essential part of a bootstrap circuit of a semiconductor device according to a modification of Embodiment 3 of the present invention.

Embodiment 3 of the present invention is described with reference to FIGS. 4 and 5. FIGS. 4 and 5 show a sectional structure of an essential part of a bootstrap circuit according to Embodiment 3 of the present invention and its modification, respectively. Their basic structures are substantially the same as that of Embodiment 1 shown in FIGS. 1 and 2. Embodiment 3 is different from Embodiment 1 in that an additional buried p+ layer 19 is intervened between the n− semiconductor layer 106 of a high-tension island and the p− substrate 105 in the n− drift layer Rn region 8 of a high-tension island according to the structure of Embodiment 3 of the present invention as shown in FIG. 4. According to the modification shown in FIG. 5, a buried p+ layer 19 is buried in the n− semiconductor layer 106 in the n− drift layer Rn region 8 of the high-tension island.

More specifically, in the structure of Embodiment 1 of the present invention shown in FIG. 2, when the power element on the high-tension side turns on and the power element on the low-tension side turns off, the potential of the opening n+ layer 12 in the n− drift layer Rn region 8 of the high-tension island becomes a floating potential, which may be a problem of exceeding a withstand voltage of the diode D3.

Then, as shown in FIGS. 4 and 5, according to Embodiment 3 of the present invention, the buried p+ layer 19 is intervened between the n− semiconductor layer 106 of the high-tension island and the p− substrate 105 or the p+ layer 19 is buried in the n− semiconductor layer 106 of the high-tension island. Thus, an effective depletion layer under the n+ layer 12 can be reduced and the potential of the n+ region 12 can be prevented from increasing high.

(Embodiment 4)

Figure 6:
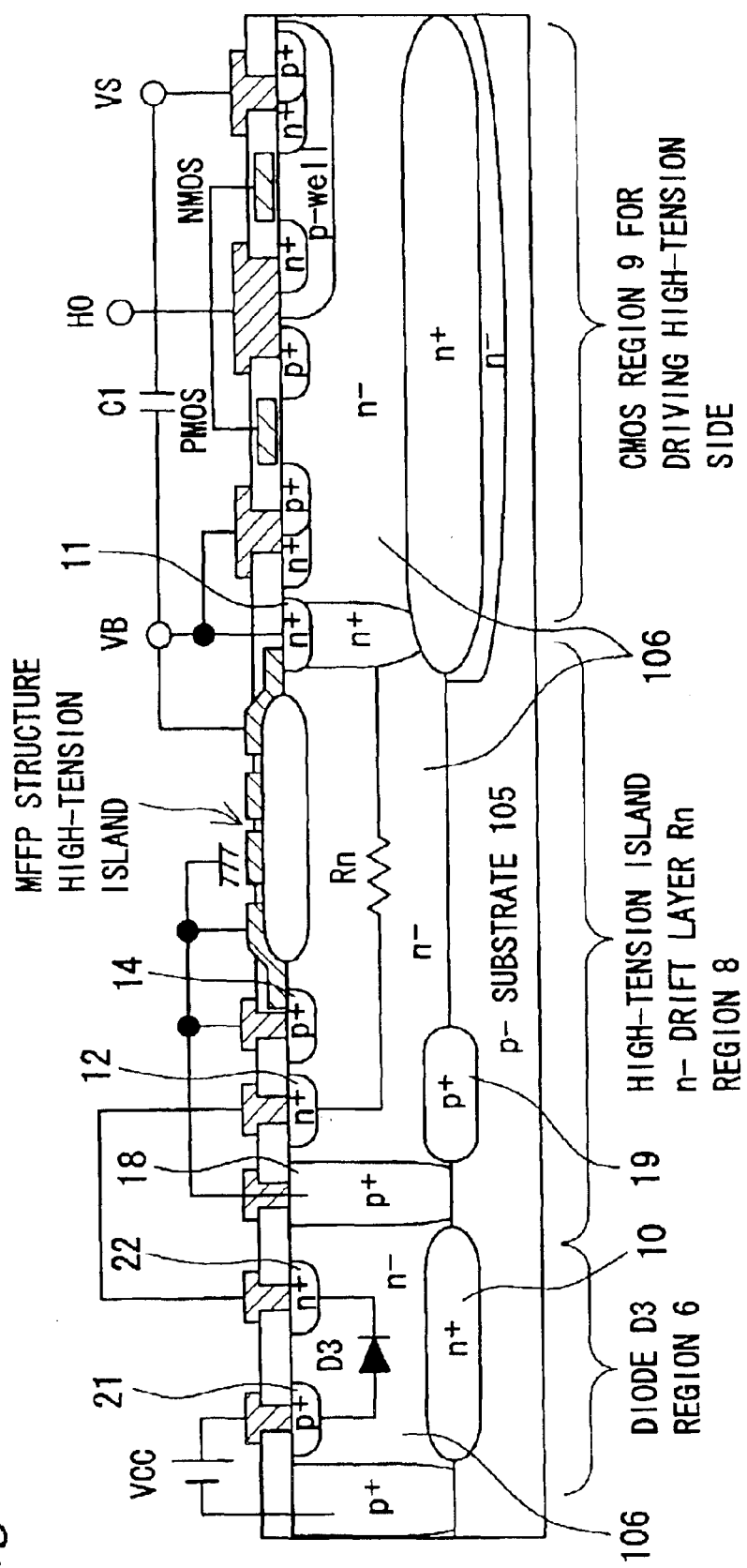
FIG. 6 is a sectional view showing an essential part of a bootstrap circuit of a semiconductor device according to Embodiment 4 of the present invention.
Figure 7:
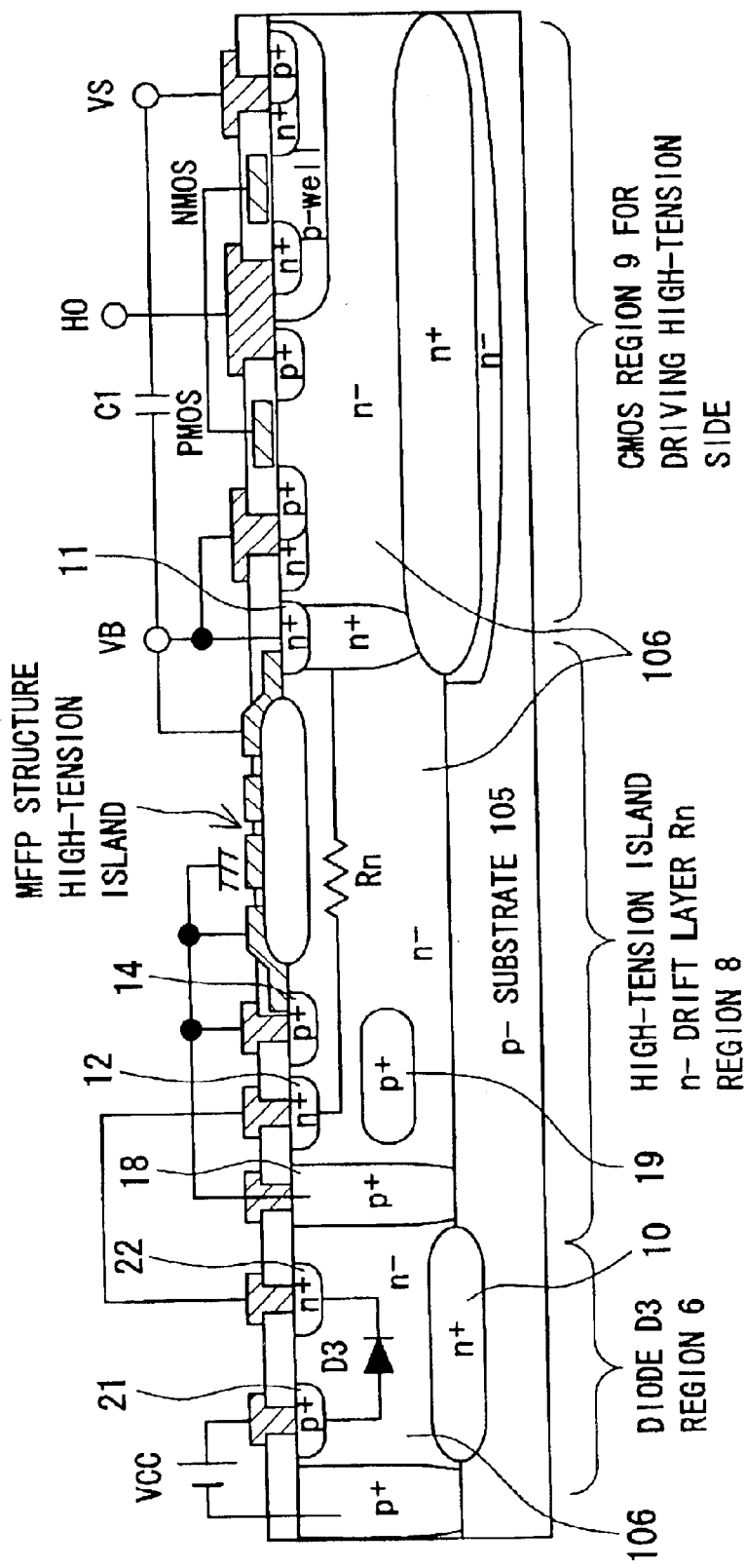
FIG. 7 is a sectional view showing an essential part of a bootstrap circuit of a semiconductor device according to a modification of Embodiment 4 of the present invention.

Embodiment 4 of the present invention is described with reference to FIGS. 6 and 7. FIGS. 6 and 7 show a sectional structure of an essential part of a bootstrap circuit according to Embodiment 4 of the present invention and its modification, respectively. Their basic structures are substantially the same as those of Embodiment 3 shown in FIGS. 4 and 5. Embodiment 4 is different from Embodiment 3 in that the feature described in Embodiment 2 is combined with that of Embodiment 3 of the present invention and applied in Embodiment 4.

More specifically, in the structure of Embodiment 3 of the present invention shown in FIGS. 4 and 5, although a pair of p+ layer 13 and 14 fixed to the same potential as that of the p− substrate are provided in the n− drift layer Rn region 8 of the high-tension island, according to the structure of Embodiment 4 of the present invention shown in FIGS. 6 and 7, the p+ layer 13 is omitted and only the p+ layer 14 is provided, and the buried p+ layer 19 is intervened between the n− semiconductor layer 106 of a high-tension island and the p− substrate 105 (shown in FIG. 6) or the buried p+ layer 19 is buried in the n− semiconductor layer 106 of the high-tension island (shown in FIG. 7) in the n− drift layer Rn region 8 of the high-tension island.

In the structure in which the p+ layer 13 is omitted, the p+ diffusion region 18 which isolates the junction of the diode D3 region 6 and the n− drift layer Rn region 8 of the high-tension island serves also as the p+ layer 13 to reduce the electric field concentration of the n+ layer 12. Therefore, since the p+ layer 13 is omitted, an area of the n− drift layer region 8 of the high-tension island in the IC chip can be reduced by an area corresponding to the omitted p+ layer 13.

In addition, according to Embodiment 3 shown in FIGS. 4 and 5 and Embodiment 4 of the present invention shown in FIGS. 6 and 7, in a preferred embodiment, as a method of forming the buried p+ layer 19 in the n− drift layer Rn region 8 of the high-tension island, there is employed a high energy ion implantation method for implanting and forming the buried p+ layer 19 in the n− semiconductor layer 106.

In another preferred embodiment, as a method of forming the buried p+ layer 19 in the n− drift layer Rn region 8 of the high-tension island, there may be employed a method growing an epitaxial layer two times which becomes the n− drift layer Rn region 8 of the high-tension island. More specifically, after a first epitaxial layer is grown, a p-type impurity is implanted, the buried p+ layer 19 is formed in the n− semiconductor layer 106 of the high-tension island, and then a second epitaxial layer is grown. Thus, the effective depletion layer just under the n+ layer 12 can be reduced and it becomes possible to prevent the potential of the n+ region 12 from increasing high.

(Embodiment 5)

Figure 8:
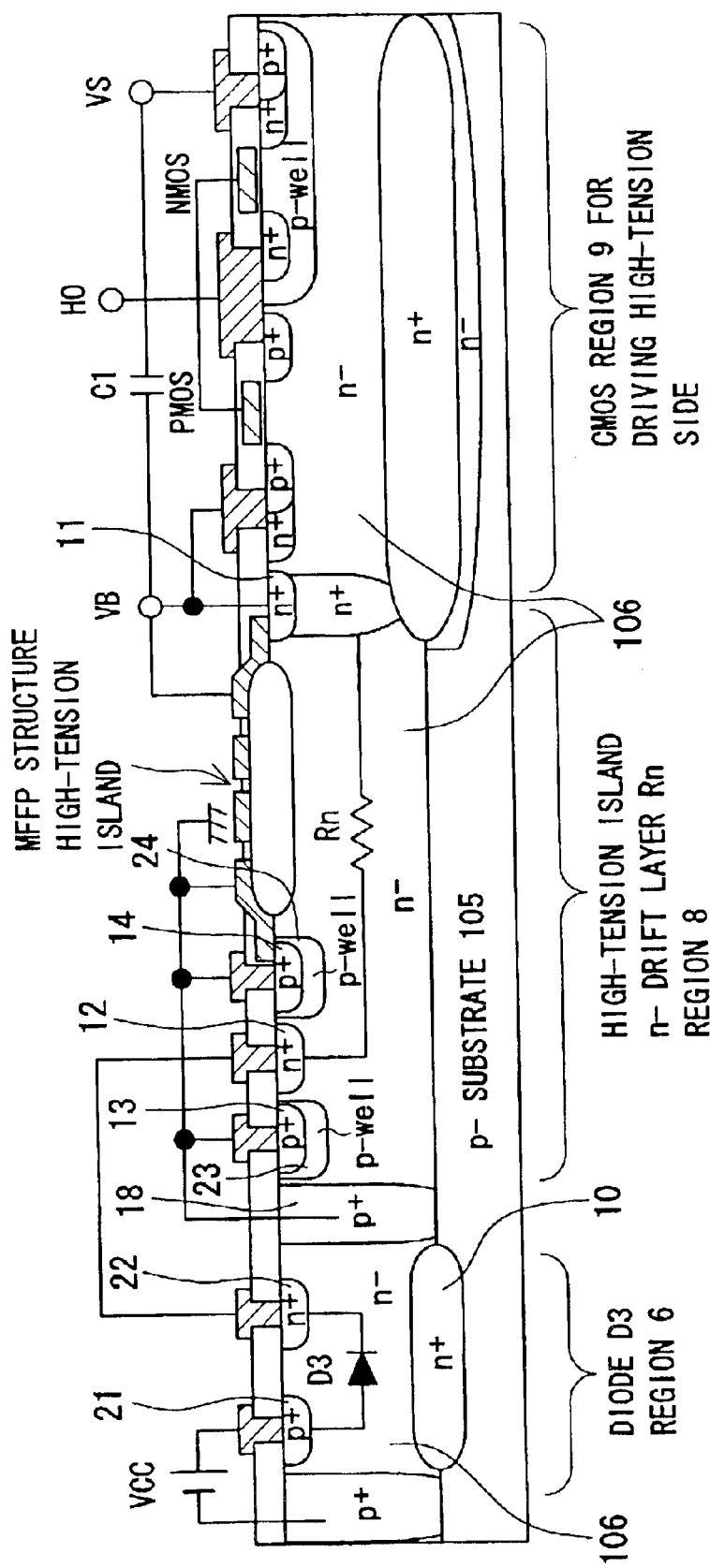
FIG. 8 is a sectional view showing an essential part of a bootstrap circuit of a semiconductor device according to Embodiment 5 of the present invention.

Embodiment 5 of the present invention is described with reference to FIG. 8. FIG. 8 shows a sectional structure of an essential part of a bootstrap circuit according to Embodiment 5 of the present invention and its basic structure is substantially the same as that of Embodiment 1 shown in FIG. 2. Embodiment 5 of the present invention provides another preferred example for preventing the potential of an n+ layer 12 from increasing high, which is different from that of Embodiment 1 in that p− well layers 23 and 24 are buried in the n− drift layer Rn region 8 of a high-tension island shown in FIG. 8.

More specifically, the p− well layers 23 and 24 surround lower and side portions of a pair of the p+ layers 13 and 14 whose potential is fixed at the same potential as in the p-substrate, respectively to thereby reduce the electric field concentration of the n+ layer 12.

Thus, an effective depletion layer in the vicinity of the n+ layer 12 can be reduced and the potential of the n+ layer 12 is prevented from increasing high. It is noted that, even if the either one of the p− well layers 23 and 24 is buried, the same effect can be obtained.

(Embodiment 6)

Figure 9:
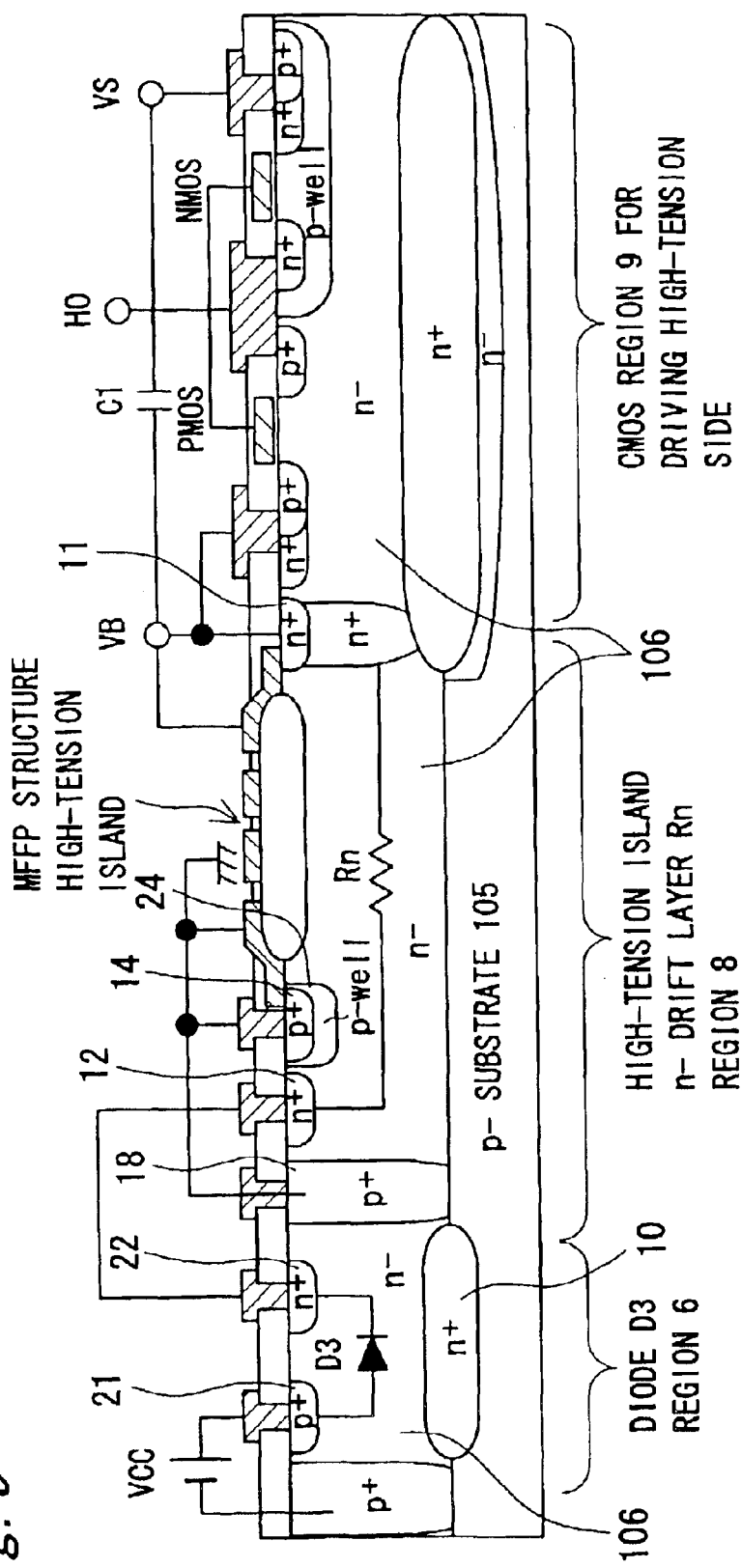
FIG. 9 is a sectional view showing an essential part of a bootstrap circuit of a semiconductor device according to Embodiment 6 of the present invention.

Embodiment 6 of the present invention is described with reference to FIG. 9. FIG. 9 shows a sectional structure of an essential part of a bootstrap circuit according to Embodiment 6 of the present invention and its basic structure is substantially the same as that of Embodiment 5 shown in FIG. 8.

Embodiment 6 is different from Embodiment 5 in that, whereas the p− well layers 23 and 24 are provided so as to surround the lower and side portions of the pair of p+ layers 13 and 14 in the n– drift layer Rn region 8 in Embodiment 5 shown in FIG. 8, the p+ layer 13 and the p– well layer 23 are removed and only the p+ layer 14 and p– well layer 24 just under the same are formed in Embodiment 6 as shown in FIG. 9.

In the structure in which the p+ layer 13 and the p– well layer 23 are omitted, the p+ diffusion region 18 which isolates the junction of the diode D3 region 6 and the n– drift layer Rn region 8 of a high-tension island serves also as the p+ layer 13 to reduce the electric field concentration of the n+ layer 12 as in the above-mentioned structure. Therefore, since the p+ layer 13 and the p– well layer 23 are omitted, an area of the n– drift layer region 8 of the high-tension island in the IC chip can be reduced by an area corresponding to the omitted portions.

(Embodiment 7)

Figure 10:
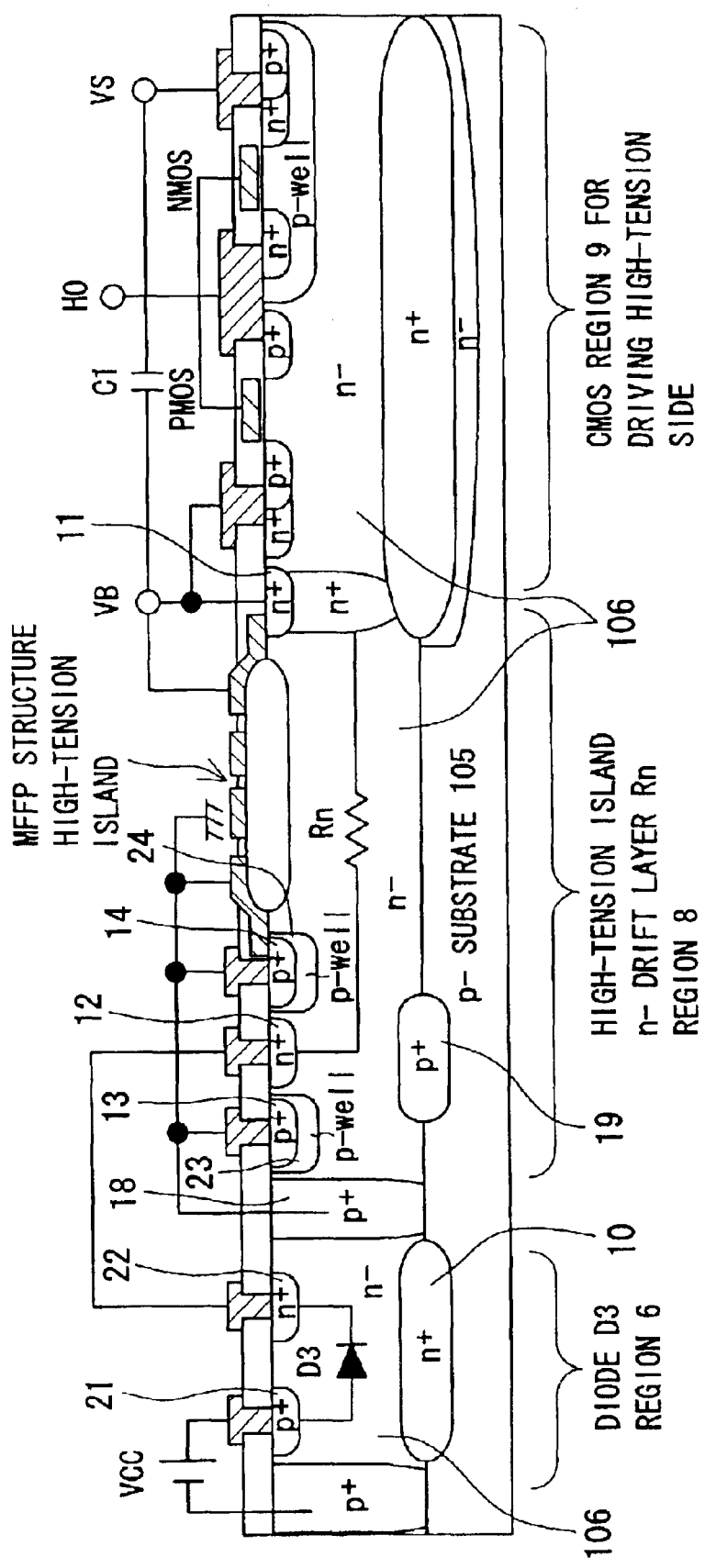
FIG. 10 is a sectional view showing an essential part of a bootstrap circuit of a semiconductor device according to Embodiment 7 of the present invention.
Figure 11:
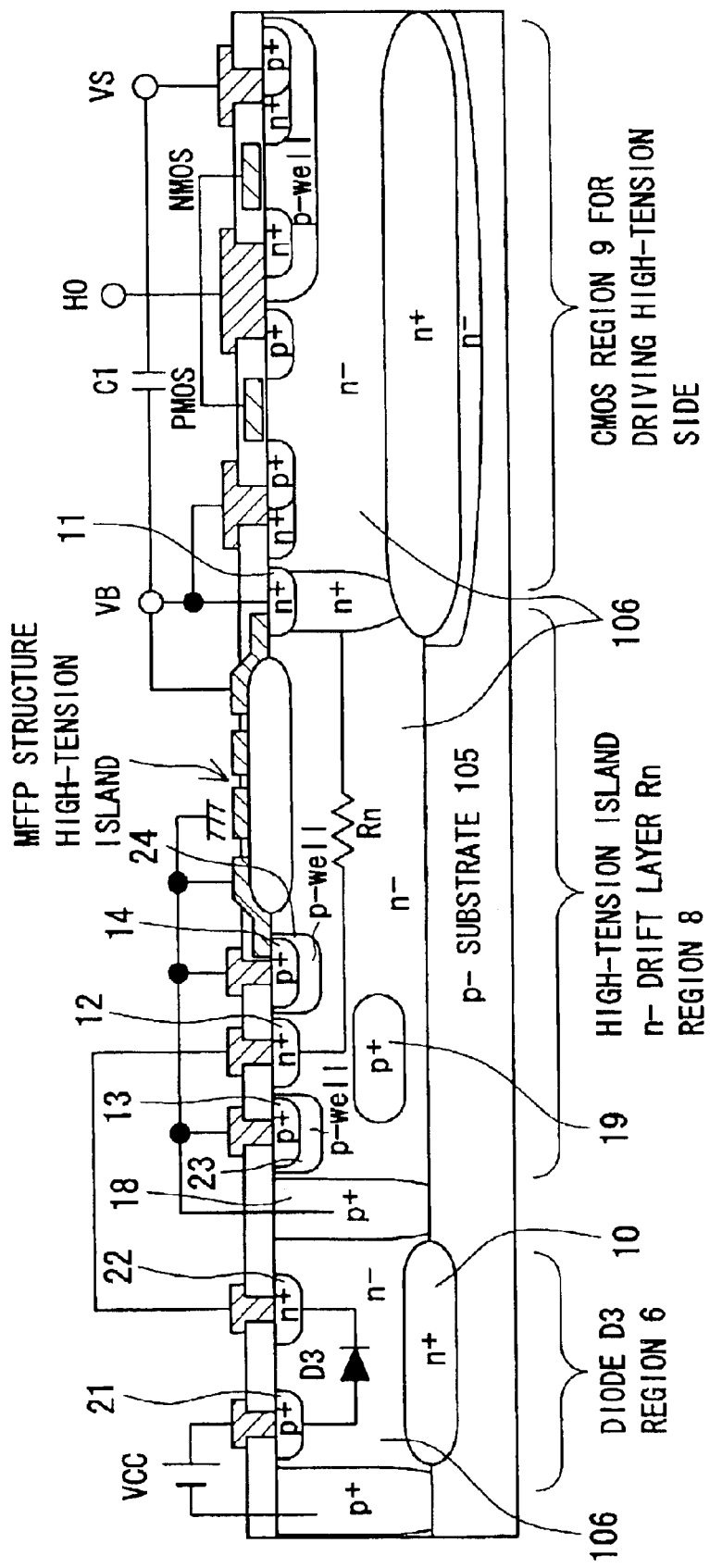
FIG. 11 is a sectional view showing an essential part of a bootstrap circuit of a semiconductor device according to a modification of Embodiment 7 of the present invention.

Embodiment 7 of the present invention is described with reference to FIGS. 10 and 11. FIGS. 10 and 11 show a sectional structure of an essential part of a bootstrap circuit according to Embodiment 7 of the present invention and its modification, respectively. Their basic structures are substantially the same as that of Embodiment 5 shown in FIG. 8. Embodiment 7 shown in FIGS. 10 and 11 is different from Embodiment 5 in that the feature of Embodiment 3 shown in FIG. 4 or 5 is combined with that of Embodiment 5 shown in FIG. 8.

More specifically, according to Embodiment 7 of the present invention, the p– well layers 23 and 24 are buried so as to surround the lower and side portions of a pair of the p+ layers 13 and 14 whose potential is fixed at the same as in the p– substrate, and the buried p+ layer 19 is intervened between the n– semiconductor layer 106 of a high-tension island and the p– substrate 105 (shown in FIG. 10) or the buried p+ layer 19 is buried in the n– semiconductor layer 106 of the high-tension island (shown in FIG. 11).

Thus, an effective depletion layer just under the n+ layer 12 and in the vicinity of the n+ layer 12 can be reduced and the potential of the n+ layer 12 is prevented from increasing high. It is noted that, even if only one of the p– well layers 23 and 24 is buried, the same effect can be obtained.

(Embodiment 8)

Figure 12:
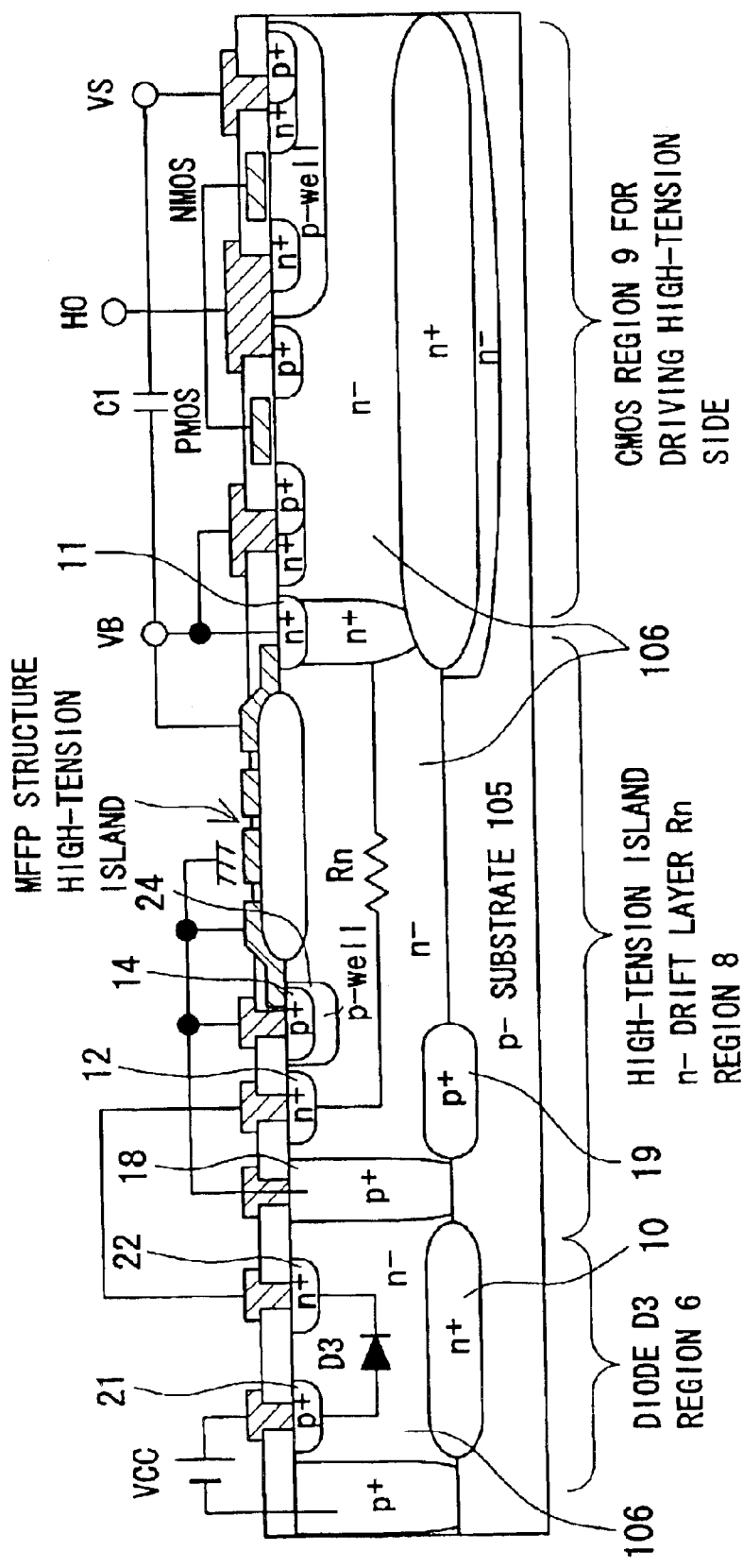
FIG. 12 is a sectional view showing an essential part of a bootstrap circuit of a semiconductor device according to Embodiment 8 of the present invention.
Figure 13:
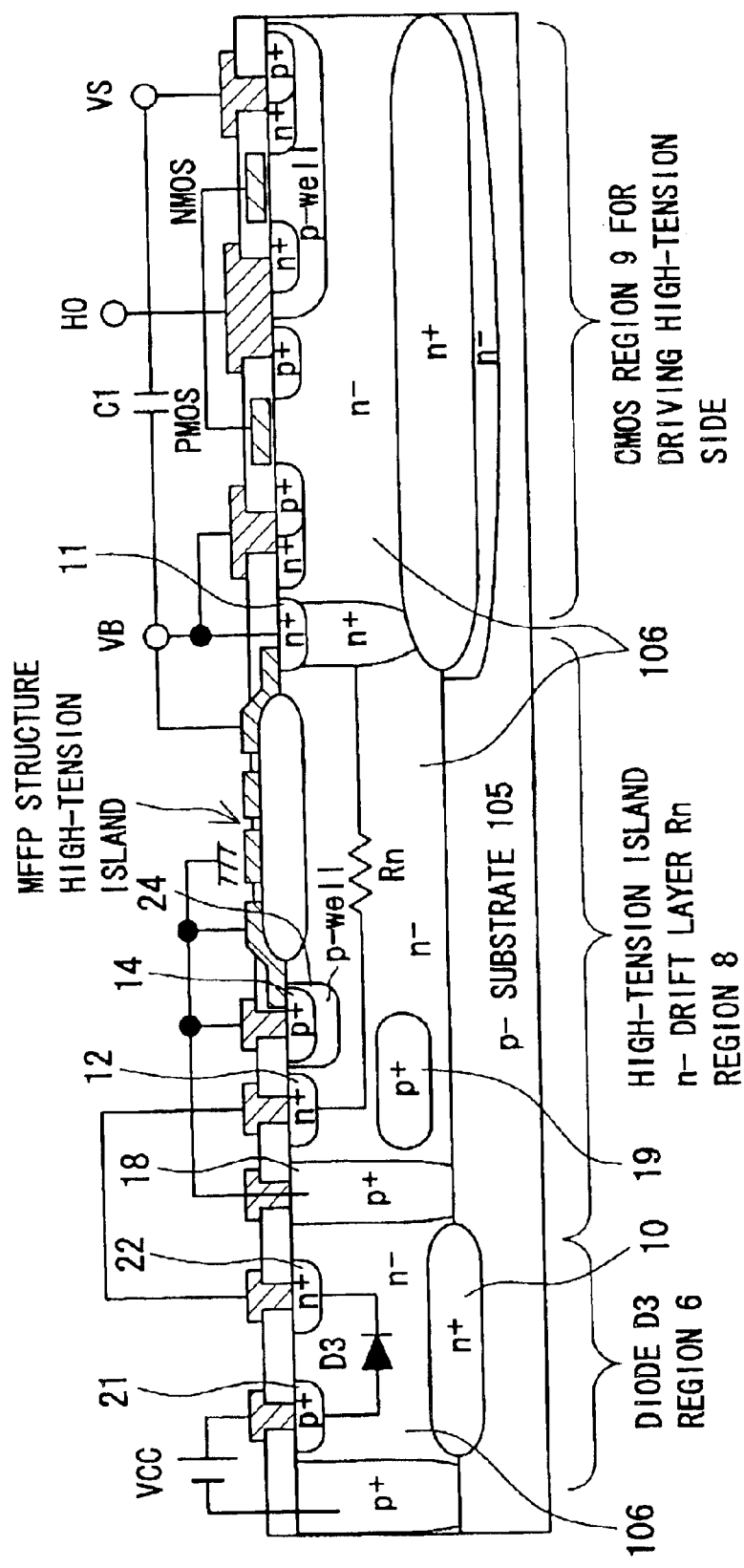
FIG. 13 is a sectional view showing an essential part of a bootstrap circuit of a semiconductor device according to a modification of Embodiment 8 of the present invention.

Embodiment 8 of the present invention is described with reference to FIGS. 12 and 13. FIGS. 12 and 13 show a sectional structure of an essential part of a bootstrap circuit according to Embodiment 8 of the present invention and its modification, respectively. Its basic structure is substantially the same as that of Embodiment 7 shown in FIGS. 10 and 11.

Embodiment 8 is different from Embodiment 7 in that, whereas the p– well layers 23 and 24 are provided so as to surround the lower and side portions of the pair of p+ layers 13 and 14 in Embodiment 7, the p+ layer 13 and the p– well layer 23 are removed and only the p+ layer 14 and p– well layer 24 are formed in Embodiment 8 as shown in FIGS. 12 and 13.

In the structure in which the p+ layer 13 and the p– well layer 23 are omitted, the p+ diffusion region 18 which isolates the junction of the diode D3 region 6 and an n– drift layer Rn region 8 of a high-tension island serves also as a p+ layer 13 to reduce the electric field concentration of the n+ layer 12. Therefore, since the p+ layer 13 and the p– well layer 23 are omitted, an area of the n– drift layer region 8 of the high-tension island in the IC chip can be reduced by an area corresponding to the omitted portions.

In addition, as in Embodiment 7 of the present invention, in this embodiment 8 the buried p+ layer 19 is intervened between the n– semiconductor layer 106 of a high-tension island and the p– substrate 105 (shown in FIG. 12) or the buried p+ layer 19 is buried in the n– semiconductor layer 106 of the high-tension island (shown in FIG. 13).

Thus, an effective depletion layer just under the n+ layer 12 and in the vicinity of the n+ layer 12 can be reduced and the potential of the n+ layer 12 is prevented from increasing high.

(Embodiment 9)

Figure 14:
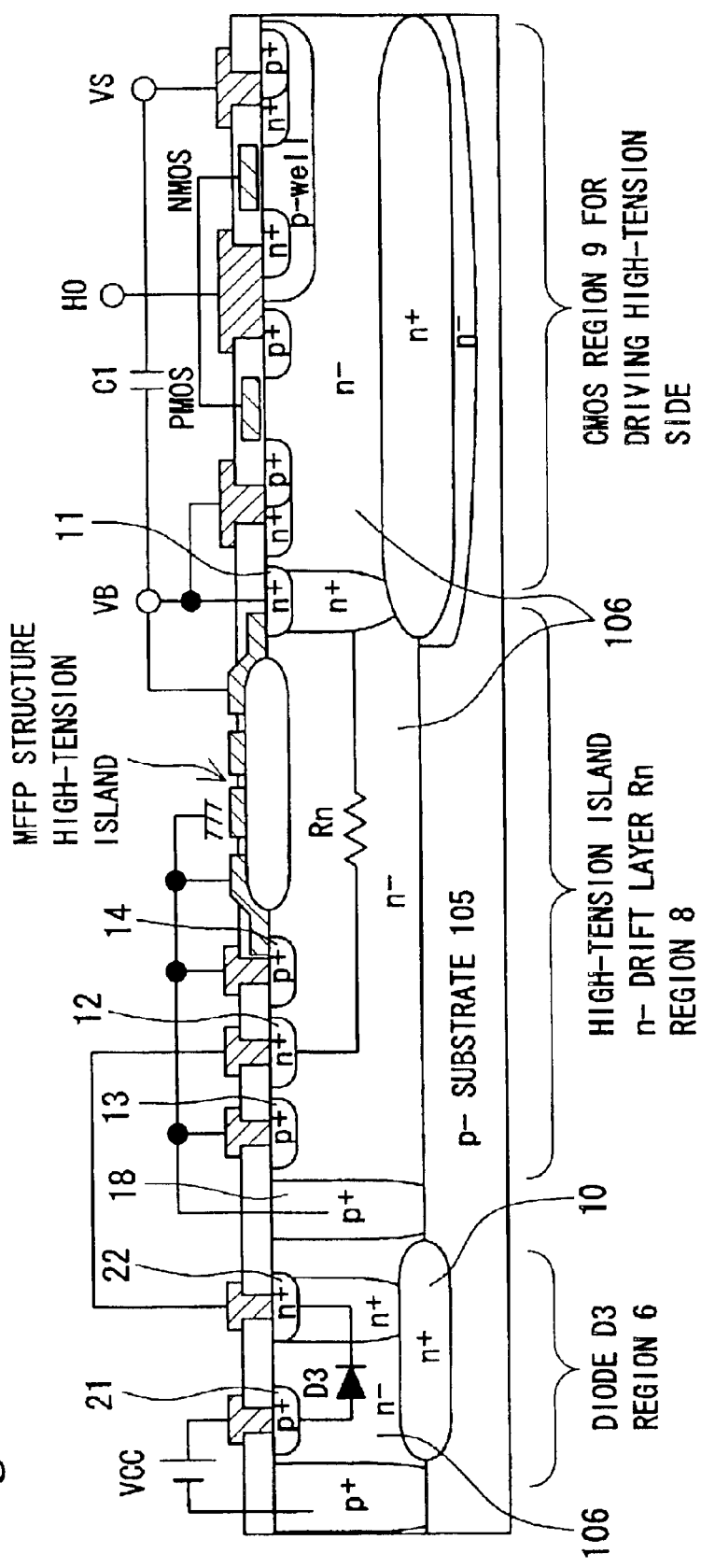
FIG. 14 is a sectional view showing an essential part of a bootstrap circuit of a semiconductor device according to Embodiment 9 of the present invention.

Embodiment 9 of the present invention is described with reference to FIG. 14. FIG. 14 shows a sectional structure of an essential part of a bootstrap circuit according to Embodiment 9 of the present invention. Its basic structure is substantially the same as that of Embodiment 1 shown in FIGS. 1 and 2.

Embodiment 9 is different from Embodiment 1 in that, according to Embodiment 9 of the present invention shown in FIG. 14, the n+ layer 22 has a buried portion provided in the n– semiconductor layer 106 in the diode D3 region 6, which is buried in the n– semiconductor layer 106 in a depth so as to be partially in contact with the buried n+ layer 10.

Thus, a base ion concentration is further increased so that the current amplification factor $H_{FE}$ of the parasitic PNP transistor 109 and an ON operation of the parasitic PNP transistor can be prevented. As a result, a current can be prevented from flowing from the anode p+ layer 21 toward the p– substrate 105 through the n– semiconductor layer 106 in the diode D3 region 6.

In addition, it is apparent that the structure of the diode D3 region 6 in Embodiment 9 of the present invention is only different from that in Embodiment 1 of the present invention. Therefore, this embodiment 9 can be applied to Embodiments 2 to 8 in which the structures of the n– drift layer Rn region 8 of the high-tension island are different although their illustrations are omitted.

(Embodiment 10)

Figure 15:
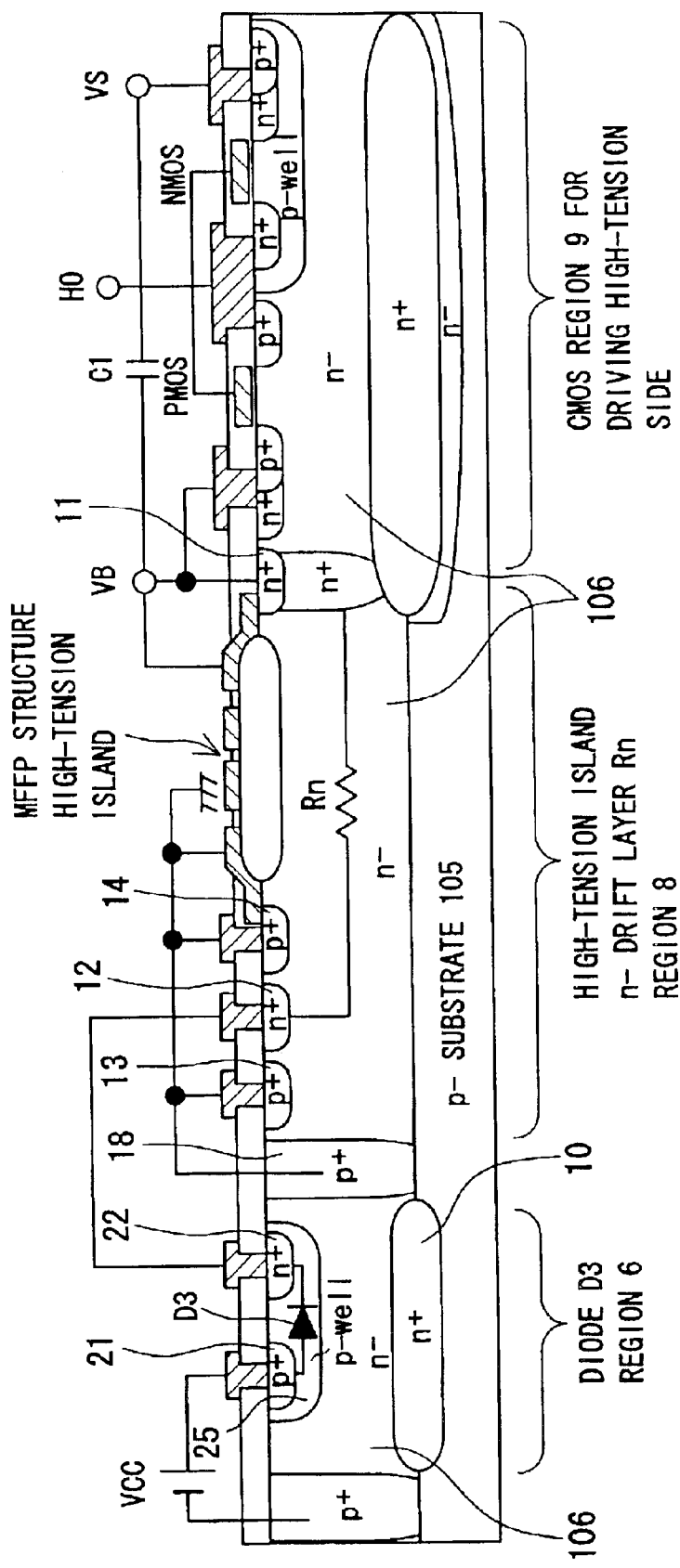
FIG. 15 is a sectional view showing an essential part of a bootstrap circuit of a semiconductor device according to Embodiment 10 of the present invention.

Embodiment 10 of the present invention is described with reference to FIG. 15. FIG. 15 shows a sectional structure of an essential part of a bootstrap circuit according to Embodiment 10 of the present invention. Its basic structure is substantially the same as that of Embodiment 1 shown in FIGS. 1 and 2.

Embodiment 10 is different from Embodiment 1 in that, according to this embodiment 10 shown in FIG. 15, a p– well 25 including the diode D3 is provided in the n– semiconductor layer 106 in the diode D3 region 6, and the anode p+ layer 21 and cathode n+ layer 22 are provided in the p– well 25 and the buried n+ layer 10 is intervened between the n– semiconductor layer 106 and the p– substrate 105.

Thus, an ON operation of a parasitic PNP transistor can be prevented as in Embodiment 1 of the present invention. As a result, a current can be prevented from flowing from the anode p+ layer 21 toward the p– substrate 105 through the n– semiconductor layer 106 in the diode D3 region 6.

In addition, it is apparent that the structure of the diode D3 region 6 in Embodiment 10 of the present invention is only different from that in Embodiment 1 of the present invention. Therefore, this embodiment 10 can be applied to Embodiments 2 to 8 in which the structures of the n– drift layer Rn region 8 of the high-tension island are different although their illustrations are omitted.

(Embodiment 11)

Figure 16:
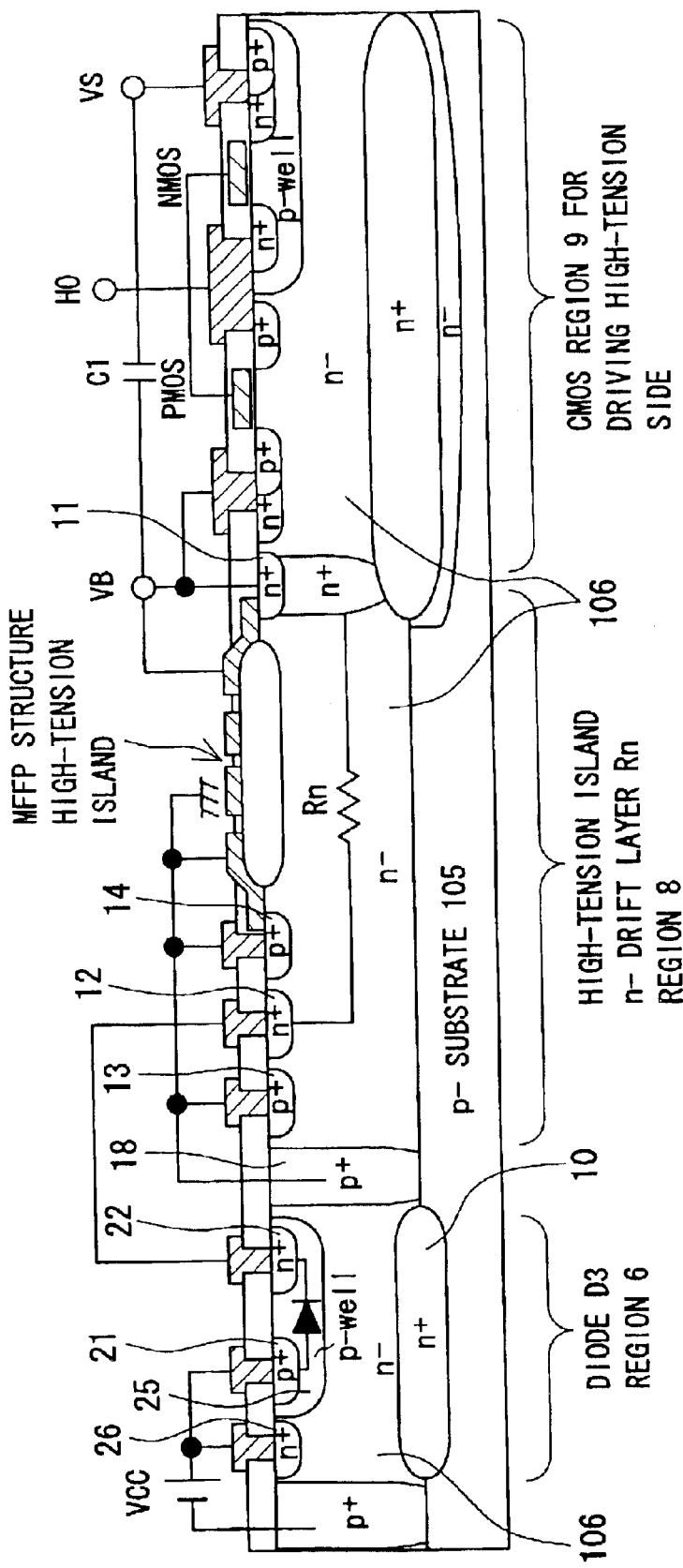
FIG. 16 is a sectional view showing an essential part of a bootstrap circuit of a semiconductor device according to Embodiment 11 of the present invention.

Embodiment 11 of the present invention is described with reference to FIG. 16. FIG. 16 shows a sectional structure of an essential part of a bootstrap circuit according to Embodiment 11 of the present invention. Its basic structure is substantially the same as that of Embodiment 10 shown in FIG. 15.

Embodiment 11 is different from Embodiment 10 in that, according to Embodiment 11 as shown in FIG. 16, an n+ layer 26 is further provided in the n– semiconductor layer 106 in the diode D3 region 6 and is connected to the anode p+ layer 21 in the p– well 25 in the n– semiconductor layer 106 in the diode D3 region 6.

Thus, the current amplification factor $H_{FE}$ of a parasitic PNP transistor 109 can be further lowered and an ON operation of the parasitic PNP transistor can be prevented. As a result, a current can be prevented from flowing from the anode p+ layer 21 toward the p– substrate 105 through the n– semiconductor layer 106 in the diode D3 region 6.

In addition, it is apparent that the structure of the diode D3 region 6 in Embodiment 11 of the present invention is only different from that in Embodiment 10 of the present invention. Therefore, this embodiment 11 can be applied to Embodiments 2 to 8 in which the structures of the n– drift layer Rn region 8 of the high-tension island are different although their illustrations are omitted.

(Embodiment 12)

Figure 17:
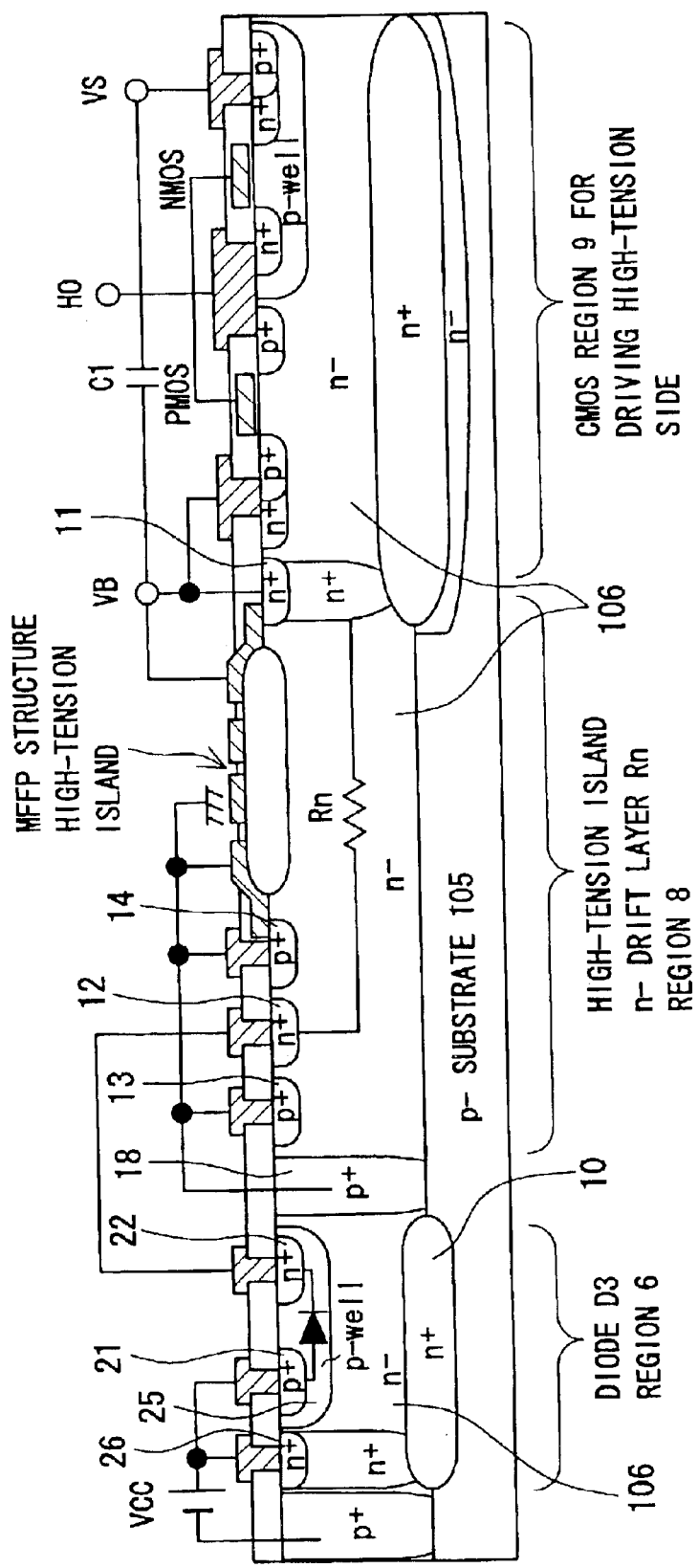
FIG. 17 is a sectional view showing an essential part of a bootstrap circuit of a semiconductor device according to Embodiment 12 of the present invention.

Embodiment 12 of the present invention is described with reference to FIG. 17. FIG. 17 shows a sectional structure of an essential part of a bootstrap circuit according to Embodiment 12 of the present invention. Its basic structure is substantially the same as that of Embodiment 11 shown in FIG. 16. Embodiment 12 is different from Embodiment 11 in that the features of Embodiment 9 and Embodiment 11 of the present invention are combined according to this embodiment 12.

More specifically, according to Embodiment 11 shown in FIG. 16, the p– well 25 is provided in the n– semiconductor layer 106 in the diode D3 region 6, the anode p+ layer 21 and the cathode n+ layer 22 are provided in the p– well 25, the buried n+ layer 10 is intervened between the n– semiconductor layer 106 and the p– substrate 105, the n+ layer 26 is further provided in the n– semiconductor layer 106 in the diode D3 region 6 and it is connected to the anode p+ layer 21 in the p– well 25 in the n– semiconductor layer 106 in the diode D3 region 6.

Whereas, according to Embodiment 12 shown in FIG. 17, the n+ layer 26 has a buried portion provided in the n– semiconductor layer 106 in the diode D3 region 6 and the buried portion of the n+ layer 26 is buried in such a depth as to be partially in contact with the buried n+ layer 10 in the n– semiconductor layer 106 in the diode D3 region 6.

Thus, a base ion concentration is further increased so that a current amplification factor $H_{FE}$ of a parasitic PNP transistor 109 can be further lowered and an ON operation of the parasitic PNP transistor can be prevented. As a result, a current can be prevented from flowing from the anode p+ layer 21 toward the p– substrate 105 through the n– semiconductor layer 106 in the diode D3 region 6.

In addition, it is apparent that the structure of the diode D3 region 6 in Embodiment 12 of the present invention is only different from that in Embodiment 11 of the present invention. Therefore, this embodiment 12 can be applied to Embodiments 2 to 8 in which the structures of the n– drift layer Rn region 8 of the high-tension island are different although their illustrations are omitted.

(Embodiment 13)

Figure 18:
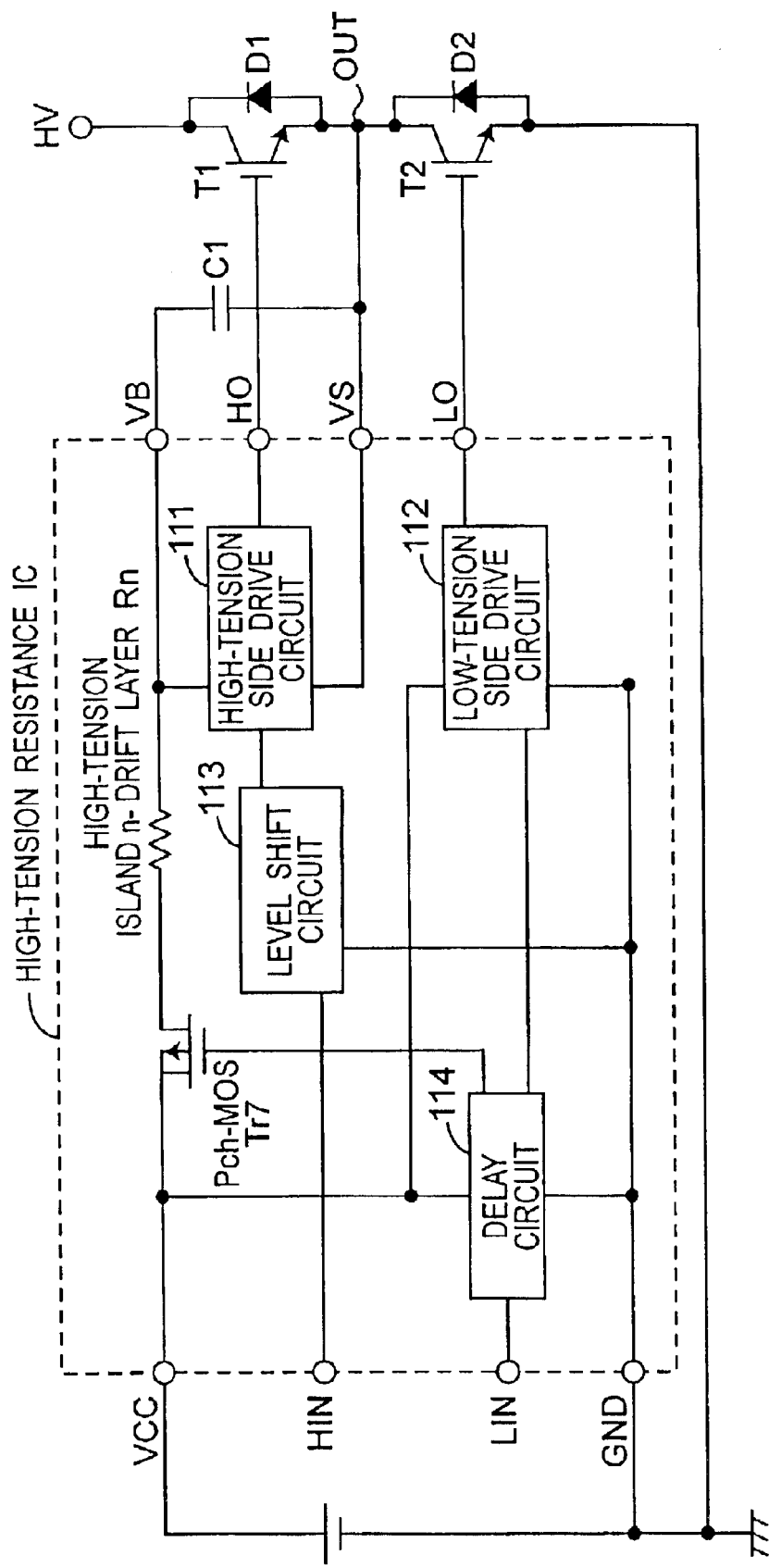
FIG. 18 is a schematic circuit view showing a structure of a semiconductor device connected with a power device according to Embodiment 13 of the present invention.
Figure 19:
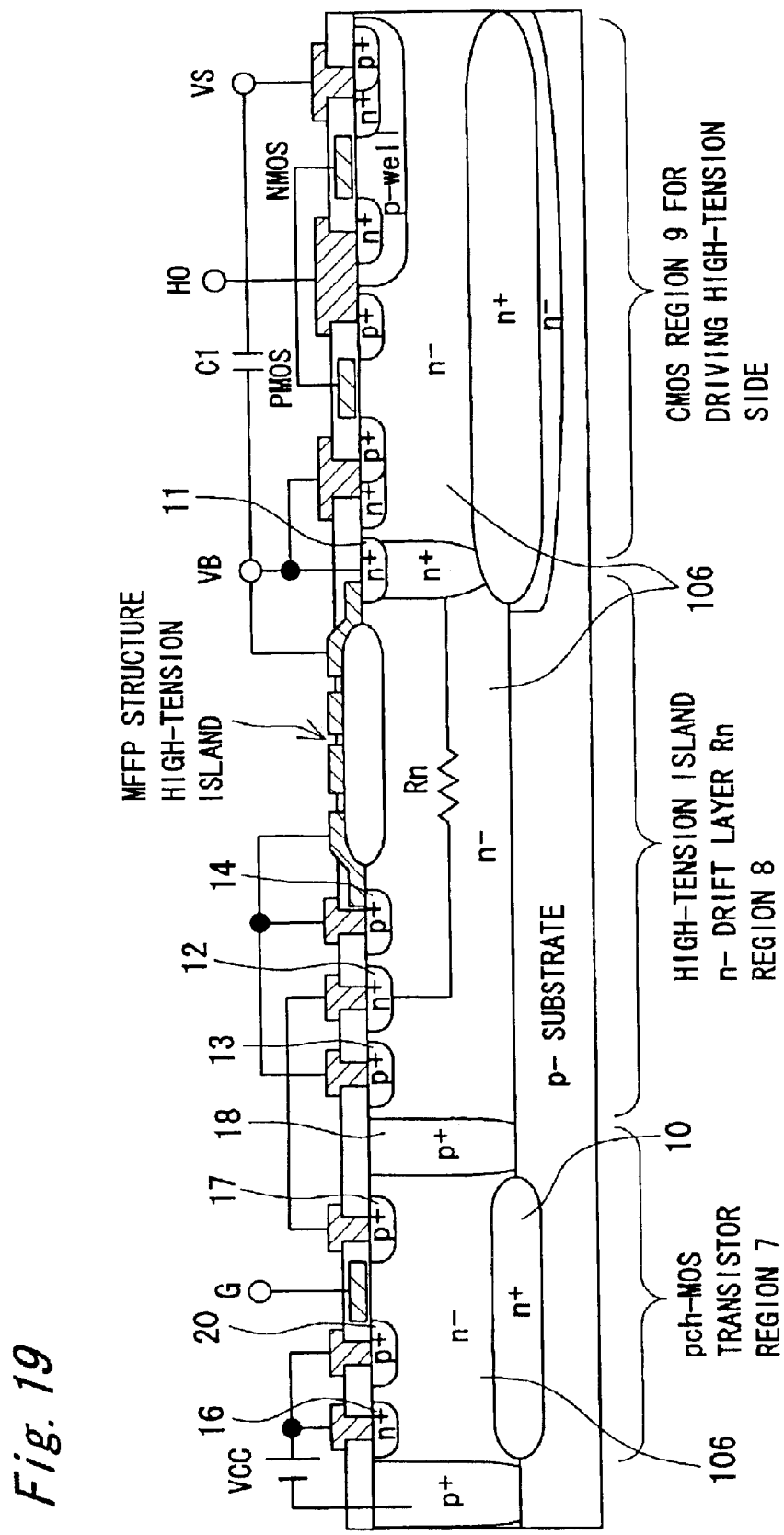
FIG. 19 is a sectional view showing an essential part of a bootstrap circuit of the semiconductor device according to Embodiment 13 of the present invention.

Embodiment 13 of the present invention is described with reference to FIGS. 18 and 19. FIG. 18 shows a schematic circuit structure according to Embodiment 13 of the present invention in which a semiconductor device and a power device are connected. FIG. 19 shows a sectional structure of an essential part of a bootstrap circuit according to Embodiment 13. Its basic structure is substantially the same as that of Embodiment 1 shown in FIGS. 1 and 2.

Embodiment 13 of the present invention is different from Embodiment 1 in that, according to Embodiment 13 as shown in FIGS. 18 and 19, there is employed a bootstrap system in which a pch-MOS transistor (Tr7) region 7 and an n– drift layer Rn region 8 of a high-tension island are mounted on a monolithic IC chip with a high-tension resistance, a first p+ layer 20 in the pch-MOS transistor region 7 is connected to a power-supply voltage Vcc, a second p+ layer 17 is connected to the external capacitor C1 through the n– drift layer Rn so that a current is applied to the external capacitor C1 through the second p+ layer 17 and through the n– drift layer Rn, and thus the external capacitor C1 is charged.

In this arrangement, as shown in FIG. 18, one terminal of a delay circuit 114 is connected to a gate of the pch-MOS transistor region 7 and each terminal of a low-tension side drive circuit 112, a level shift circuit 113 and the delay circuit 114 is connected to a ground potential GND. Thus, the pch-MOS transistor region 7 turns on in synchronization with timing of the ON operation of a transistor T2 on the low-tension side of an output element of a power converter (power device).

Meanwhile, the external capacitor C1 is connected between a VB terminal and a VS terminal and one terminal of the external capacitor C1 is connected to the power supply voltage Vcc of e.g. 15V through the n– drift layer Rn and through the pch-MOS transistor region 7 on the monolithic IC chip. When a lower transistor T2 turns on and an output terminal OUT is maintained almost at a ground potential, a charging current is applied to the external capacitor C1. The external capacitor C1 maintains the power-supply voltage Vcc as a charging voltage without dropping the power-supply voltage. Thus, the low-tension side drive circuit 112 is driven by a relatively low power-supply voltage Vcc and the high-tension side drive circuit 111 is driven by the voltage Vcc charged in the external capacitor C1.

As described above, since the pch-MOS transistor region turns on in synchronization with timing of the ON operation of the transistor T2 on the low-tension side of the output device of the power converter, when the pch-MOS transistor region 7 turns on, a current is applied from the power-supply voltage Vcc connected to the first p+ layer 20 in the pch-MOS transistor region 7 to the external capacitor C1 through the n– drift layer Rn, and thus the external capacitor C1 is charged. Thus, in the bootstrap system, it is not necessary to additionally provide a floating power supply on the high-tension side by employing the charged voltage Vcc as a power-supply voltage for the high-tension side drive circuit 111.

In this arrangement, the sectional structure of the bootstrap circuit shown in FIG. 19 includes the pch-MOS transistor region 7, n– drift layer Rn region 8 of the high-tension island and a CMCOS transistor region 9 for driving the high-tension side, and the buried n+ layer 10 is intervened between the n– semiconductor layer 106 and the p– substrate 105 in the pch-MOS transistor region 7.

In addition, p+ layers 13 and 14 whose potential is the same as in the p– substrate 105 are provided in the n– drift layer Rn region 8 of the high-tension island to thereby enlarge a depletion layer and reduce an electric field concentration in an n+ region 12. Furthermore, a p+ diffusion region 18 which isolates the junction of the pch-MOS transistor region 7 and the n− drift layer Rn region 8 of the high-tension island is formed as an interlayer insulating film in such a depth as to reach the p− substrate 105 in the n− semiconductor layer 106.

As can be apparent from the sectional structure of the above bootstrap circuit, the pch-MOS transistor region 7 includes the first p+ layer 20, a second p+ layer 17 and a backgate n+ layer 16 in the n− semiconductor layer 106 in the pch-MOS transistor region 7 and the buried n+ layer 10 in the pch-MOS transistor region is intervened between the n− semiconductor layer layer 106 and the p− substrate 105 in the pch-MOS transistor region 7.

As a result, a base ion concentration is increased so that a current amplification factor $H_{FE}$ of a parasitic PNP transistor 109 can be lowered and an ON operation of the parasitic PNP transistor can be prevented much better than in the conventional structure. Consequently, a current can be prevented from flowing from the first p+ layer 20 toward the p− substrate 105 through the n− semiconductor layer 106 in the pch-MOS transistor region 7.

In addition, it is apparent that only the structure of the chargeable semiconductor device portion (Tr7 region) in Embodiment 13 of the present invention is different from that in Embodiment 1. Therefore, this embodiment 13 can be applied to Embodiments 2 to 8 having different structures of the n− drift layer Rn region 8 of the high-tension island although their illustrations are omitted.

(Embodiment 14)

Figure 20:
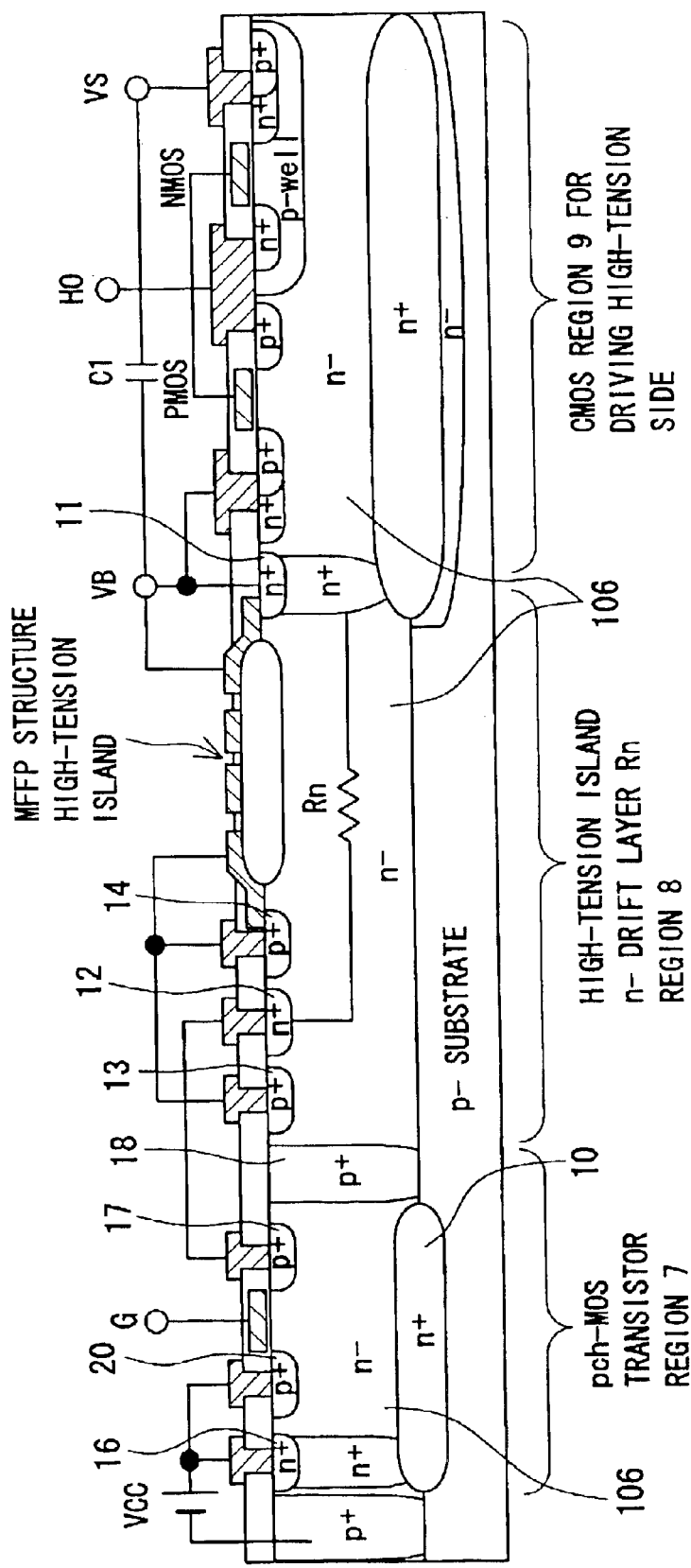
FIG. 20 is a sectional view showing an essential part of a bootstrap circuit of a semiconductor device according to Embodiment 14 of the present invention.

Embodiment 14 of the present invention is described with reference to FIG. 20. FIG. 20 shows a sectional structure of an essential part of a bootstrap circuit according to Embodiment 14 of the present invention. Its basic structure is substantially the same as that of Embodiment 13 shown in FIGS. 18 and 19.

Embodiment 14 is different from Embodiment 13 in that, according to Embodiment 14 shown in FIG. 20, the backgate n+ layer 16 provided in the n− semiconductor layer 106 in the pch-MOS transistor region 7 has a buried portion which is buried to a depth in the n− semiconductor layer 106 so as to be partially in contact with the buried n+ layer 10.

As a result, the base ion concentration is further increased so that a current amplification factor $H_{FE}$ of a parasitic PNP transistor 109 can be lowered and an ON operation of the parasitic PNP transistor can be prevented. Thus, a current can be prevented from flowing from the first anode p+ layer 20 toward the p− substrate 105 through the n− semiconductor layer 106 in the pch-MOS transistor region 7.

In addition, it is apparent that only the structure of the chargeable semiconductor device portion in Embodiment 14 of the present invention is different from that in Embodiment 13. Therefore, this embodiment 14 can be applied to Embodiments 2 to 8 having different structures of the n− drift layer Rn region 8 of the high-tension island although their illustrations are omitted.

(Embodiment 15)

Figure 21:
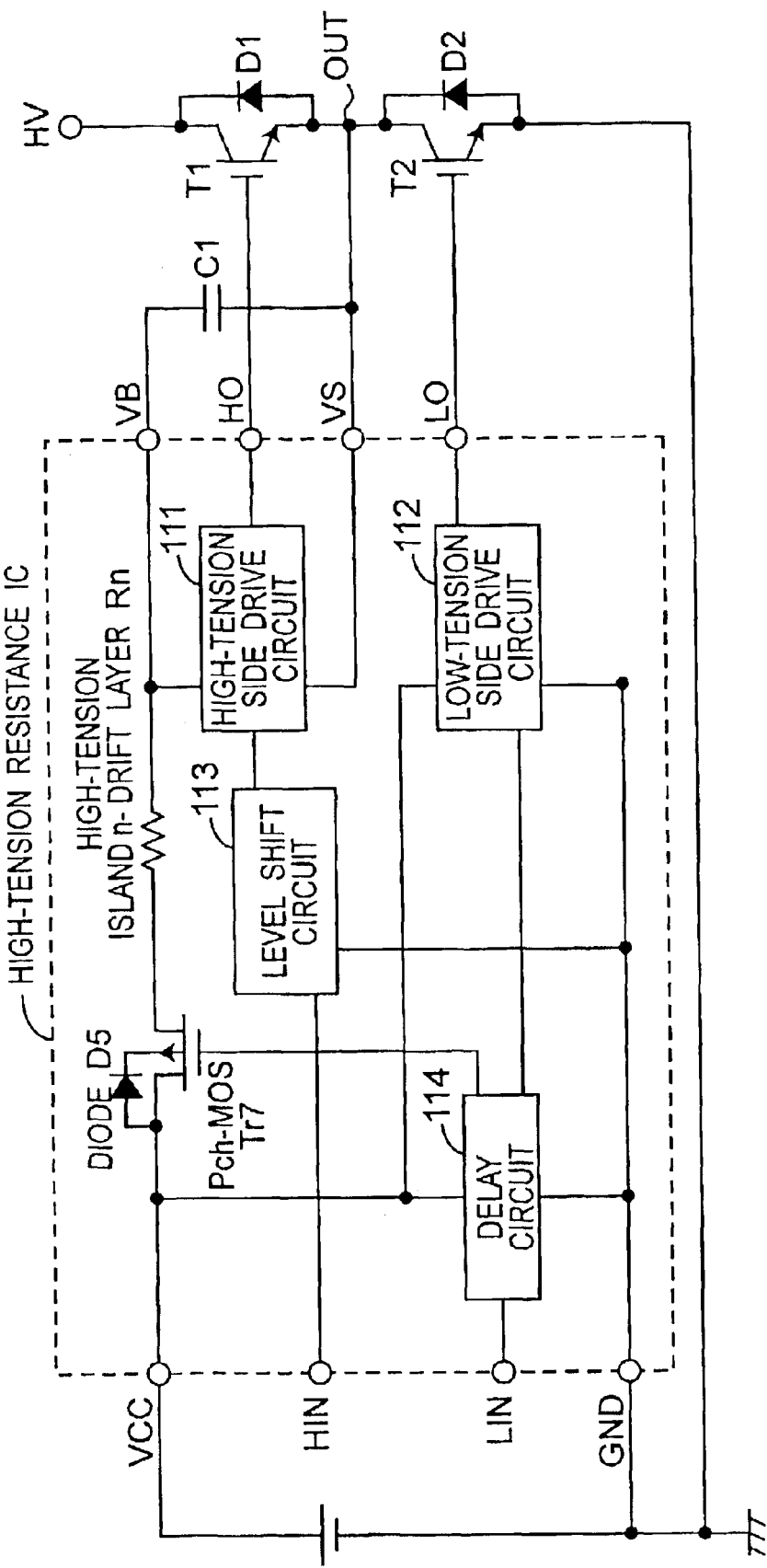
FIG. 21 is a schematic circuit view showing a structure of a semiconductor device connected with a power device according to Embodiment 15 of the present invention.
Figure 22:
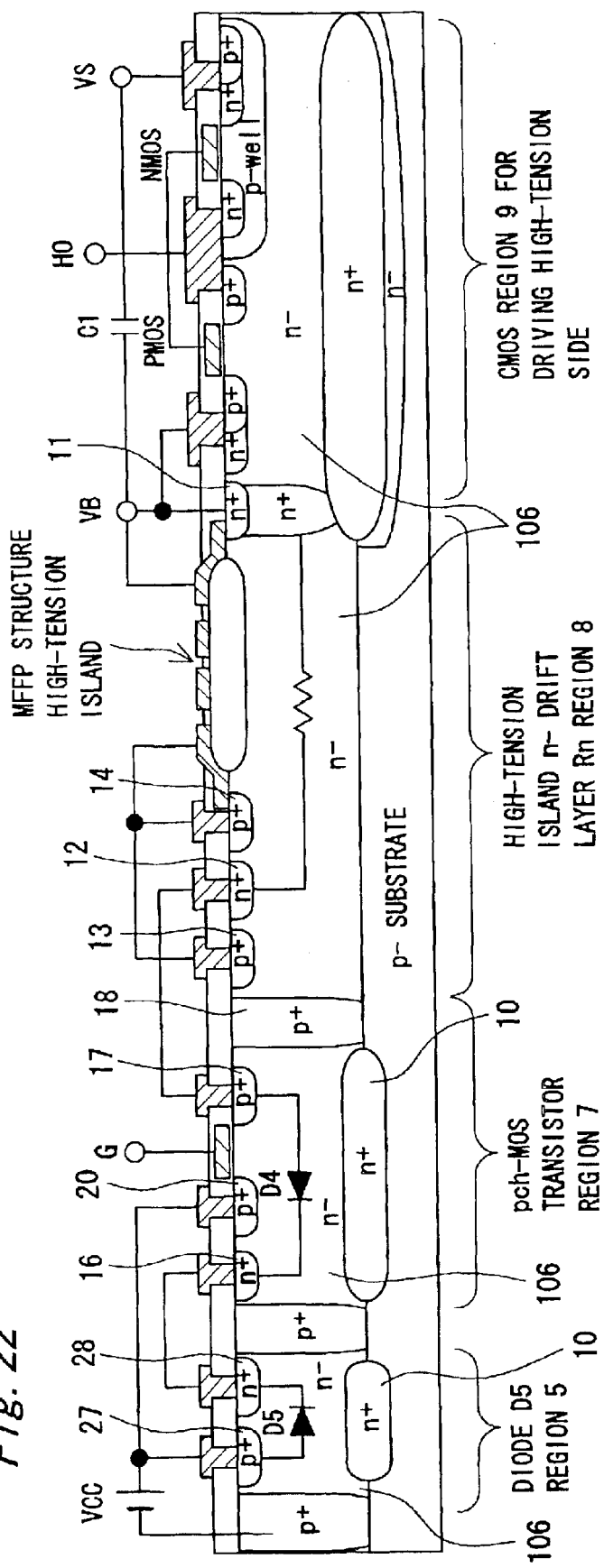
FIG. 22 is a sectional view showing an essential part of a bootstrap circuit of the semiconductor device according to Embodiment 15 of the present invention.

An embodiment 15 of the present invention is described with reference to FIGS. 21 and 22. FIG. 21 shows a schematic circuit structure according to the embodiment 15 of the present invention in which a semiconductor device and a power device are connected and FIG. 22 shows a sectional structure of an essential part of a bootstrap circuit according to the embodiment 15 of the present invention. Its basic structure is substantially the same as that of the embodiment 13 shown in FIGS. 18 and 19.

Embodiment 15 shown in FIGS. 21 and 22 is different from Embodiment 13 in that a diode D5 region 5 is additionally mounted in the opposite direction to a body drain diode D4 of the pch-MOS transistor (Tr7). In this structure, when the pch-MOS transistor region 7 turns off, a reverse recovery current flows through the body drain diode D4 between a second p+ layer 17 and a backgate n+ layer 16 in the pch-MOS transistor region 7.

As shown in FIGS. 21 and 22, the diode D5 region 5 is provided in order to prevent the reverse recovery current from flowing through the body drain diode D4 in the pch-MOS transistor region 7 when the pch-MOS transistor region 7 switches from on to off. A first p+ layer 20 of the pch-MOS transistor region 7 is connected to an anode p+ layer 27 of the diode D5 region 5, which are both connected to the power-supply voltage Vcc. The backgate n+ layer 16 of the pch-MOS transistor region 7 is connected to a cathode n+ layer 28 of the diode D5 region 5. The other structures are the same as in Embodiment 13 of the present invention shown in FIGS. 18 and 19.

In this arrangement, the sectional structure of the bootstrap circuit shown in FIG. 22 includes the diode D5 region 5, pch-MOS transistor region 7, n− drift layer Rn region 8 of a high-tension island and CMOS transistor region 9 for driving the high-tension side. A buried n+ layer 10 is buried between the n− semiconductor layer 106 and the p− substrate 105 in each of the pch-MOS transistor region 7 and the n− drift layer Rn region 8 of the high-tension island.

In addition, in the n− drift layer Rn region 8 of the high-tension island, p+ layers 13 and 14 whose potential is the same as in the p− substrate 105 are provided in order to enlarge a depletion layer and reduce an electric field concentration of the n+ region 12. Furthermore, a p+ diffusion region 18 which isolates the junction of the pch-MOS transistor region 7 and the n− drift layer Rn region 8 of the high-tension island is formed in the n− semiconductor layer 106 as an interlayer insulating film in a depth so as to reach the p− substrate 105.

As it is apparent from the sectional structure of the bootstrap circuit, when the pch-MOS transistor region 7 is in the ON state, the capacitor C1 provided between the terminal VB and the terminal VS can be charged with the power-supply voltage Vcc, and the ON operation of a parasitic transistor can be controlled much better than in the prior art. Thus, the bootstrap circuit can be mounted on the monolithic IC chip. In addition, when the pch-MOS transistor region 7 is in the OFF state, a discharging current is prevented from flowing through the body drain diode D4.

Furthermore, it is apparent that only the structure of a chargeable semiconductor device portion in Embodiment 15 of the present invention is different from that in Embodiment 13. Therefore, this embodiment 15 can be applied to Embodiments 2 to 8 having different structures of the n− drift layer Rn region 8 of the high-tension island although their illustrations are omitted.

As for the structure of the diode D5 region 5, other than the structure shown in FIG. 22, the structure of the diode D5 region 5 according to this embodiment 15 can be applied to the structures of the diode D3 described in Embodiments 9 to 12 of the present invention although their illustrations are omitted.

In addition, as for structure of the pch-MOS transistor region 7, other than the structure shown in FIG. 22, the structure of the pch-MOS transistor region 7 according to Embodiment 15 can be applied to the pch-MOS transistor region 7 described in Embodiment 14 although its illustration is not shown.

Furthermore, according to the structure shown in FIG. 22, although the junction of the pch-MOS transistor region 7 and the diode D5 region 5 is isolated, the structure is not limited to this and even if both of the regions 5 and 7 exist in the same n− semiconductor layer 106, the same effect can be obtained.

(Embodiment 16)

Figure 23:
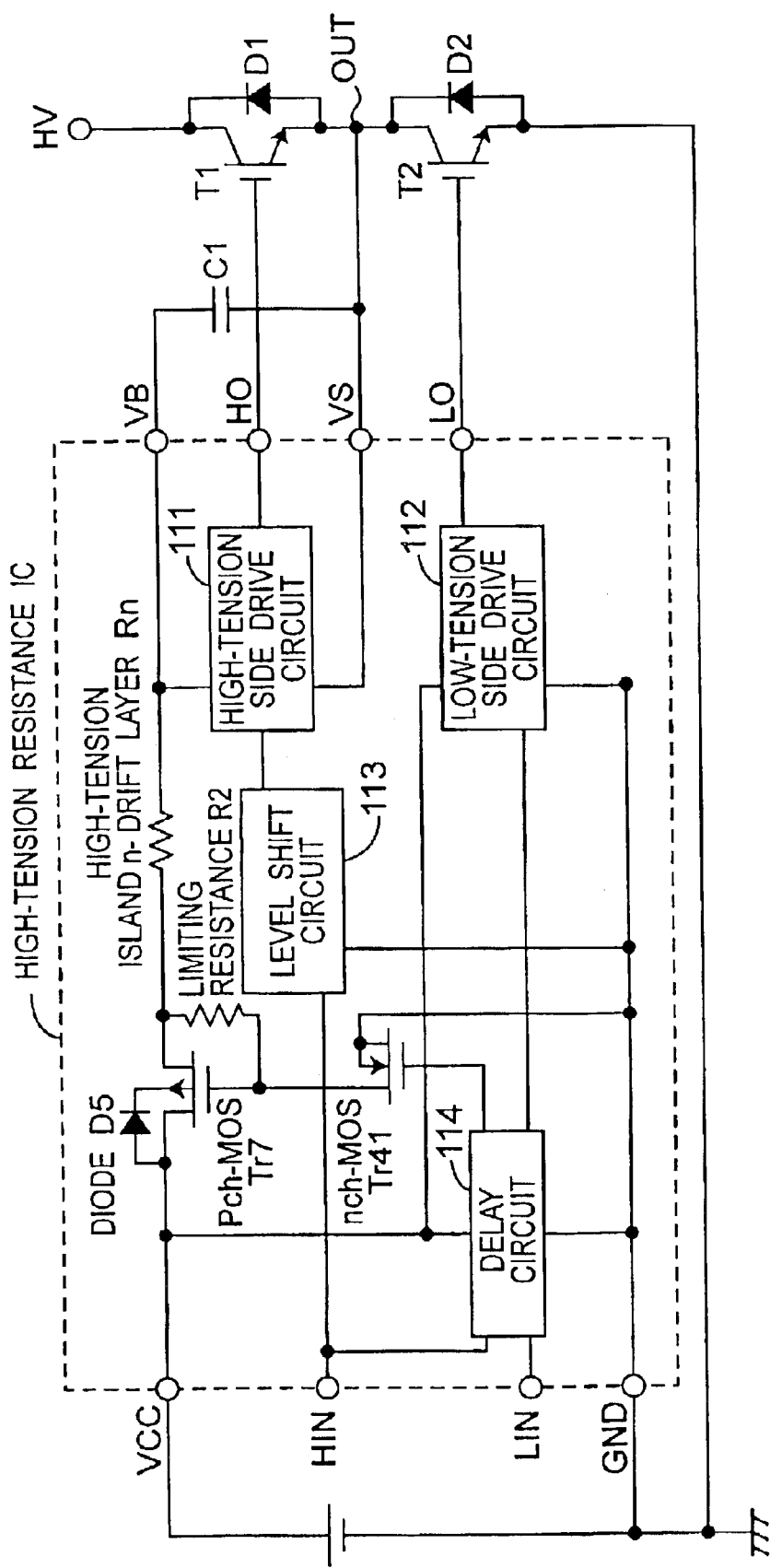
FIG. 23 is a schematic circuit view showing a structure of a semiconductor device connected with a power device according to Embodiment 16 of the present invention.
Figure 24:
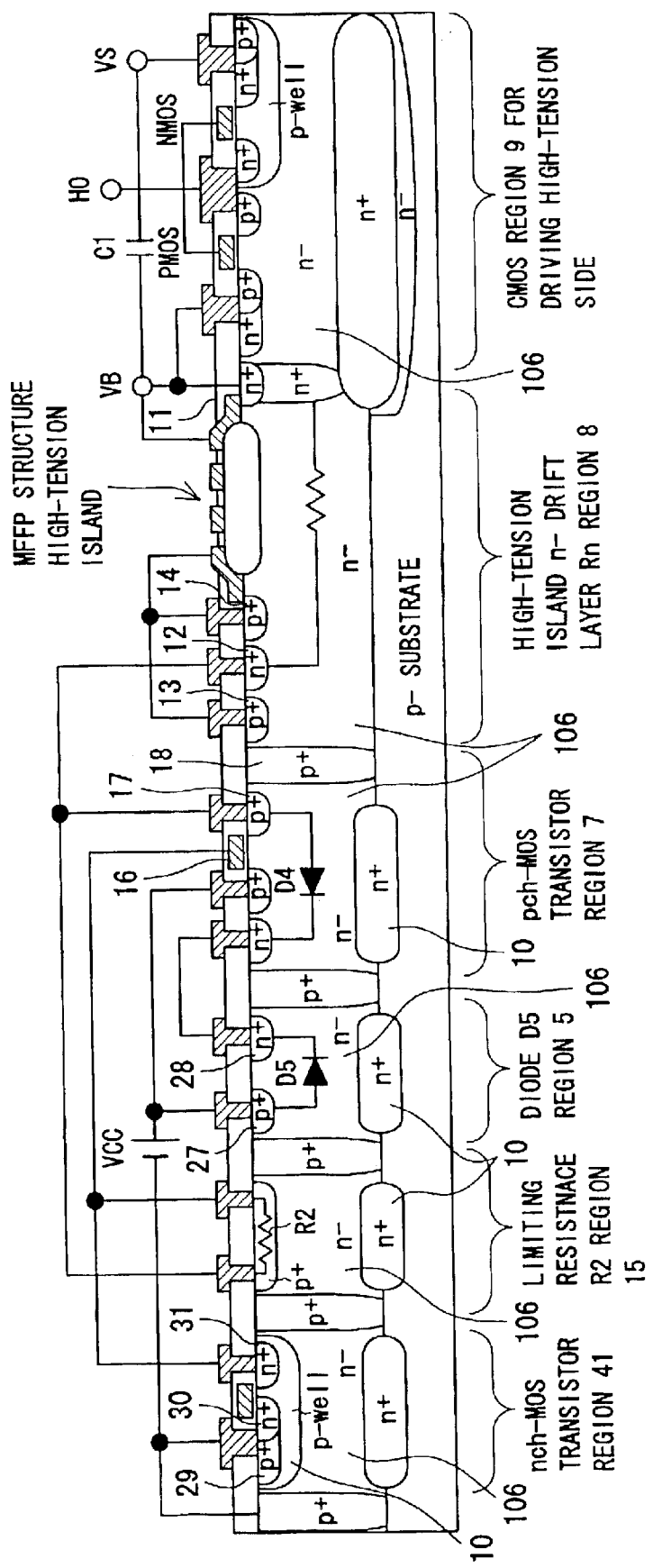
FIG. 24 is a sectional view showing an essential part of a bootstrap circuit of the semiconductor device according to Embodiment 16 of the present invention.

Embodiment 16 of the present invention is described with reference to FIGS. 23 and 24. FIG. 23 shows a schematic circuit structure according to Embodiment 16 of the present invention in which a semiconductor device and a power device are connected. FIG. 24 shows a sectional structure of an essential part of a bootstrap circuit according to Embodiment 16 of the present invention. Its basic structure is substantially the same as that of Embodiment 15 shown in FIGS. 21 and 22.

Embodiment 16 is different from Embodiment 15 in that a limiting resistance R2 region 15 and an Nch-MOS transistor region 41 are additionally mounted on the monolithic IC chip with a high-tension resistance according to this embodiment 16 shown in FIGS. 23 and 24.

In this structure, as shown in FIGS. 23 and 24, the Nch-MOS transistor region 41 is a drive circuit for driving the pch-MOS transistor region 7. The limiting resistance R2 region 15 is connected between a gate and a second p+ layer 17 of the pch-MOS transistor region 7, the gate of the pch-MOS transistor region 7 is connected to the ground potential GND through the Nch-MOS transistor region 41. A backgate p+ layer 29 and a source n+ layer 30 of the Nch-MOS transistor region 41 are also connected to the ground potential GND.

In addition, a gate of the nch-MOS transistor region 41 is connected to one terminal of the delay circuit 114. Other structures are the same as in Embodiment 15 of the present invention shown in FIGS. 21 and 22.

The sectional structure of the bootstrap circuit shown in FIG. 24 includes the nch-MOS transistor region 41, limiting resistance R2 region 15, diode D5 region 5, pch-MOS transistor region 7, n− drift layer Rn region 8 of a high-tension island and a CMOS transistor region 9 for driving the high-tension side. A buried n+ layer 10 is intervened between the n− semiconductor layer 106 and the p− substrate 105 in each of the Nch-MOS transistor region 41, limiting resistance R2 region 15, diode D5 region 5 and pch-MOS transistor region 7.

In addition, in the n− drift layer Rn region 8 of the high-tension island, p+ layers 13 and 14 whose potential is the same as in the p− substrate 105 are provided in order to enlarge a depletion layer and reduce an electric field concentration of an n+ region 12. Furthermore, a p+ diffusion region 18 which isolates the junction of the pch-MOS transistor region 7 and the n− drift layer Rn region 8 of the high-tension island is formed as an interlayer insulating film in the n− semiconductor layer 106 in a depth so as to reach the p− substrate 105.

As it is apparent from the sectional structure of the bootstrap circuit, when the pch-MOS transistor region 7 is in the ON state, since the external capacitor C1 between the terminal VB and the terminal VS can be charged with the power-supply voltage Vcc, the ON operation of a parasitic transistor can be prevented much better than in the prior art, and the bootstrap circuit can be mounted on the monolithic IC chip.

In addition, when the pch-MOS transistor region 7 is in the OFF state, a charged current is prevented from discharging through the body drain diode D4. Furthermore, when an output element (i.e., T1) on the high-tension side of a power converter is in the ON state, the pch-MOS transistor can be prevented from turning on in the opposite direction to the charging direction.

Furthermore, it is apparent that only the structure of a chargeable semiconductor device portion in Embodiment 16 of the present invention is different from that in Embodiment 15. Therefore, the feature of Embodiment 16 can be applied to Embodiments 2 to 8 having different structures of the n− drift layer Rn region 8 of the high-tension island although their illustrations are omitted.

As for the structure of the diode D5 region 5, other than the structure shown in FIG. 24, the feature of the diode D5 region 5 according to this embodiment 16 can be applied to the structures of the diode D3 region described in Embodiments 9 to 12 of the present invention although their illustrations are omitted.

In addition, as for the structure of the pch-MOS transistor region 7, other than the structure shown in FIG. 24, the feature of the pch-MOS transistor region 7 according to this embodiment 16 can be applied to the pch-MOS transistor region 7 described in Embodiment 14 although its illustration is not shown.

Furthermore, according to the structure shown in FIG. 24, although the junctions of the Nch-MOS transistor region 41, limiting resistance R2 region 15, diode D5 region 5 and pch-MOS transistor region 7 are isolated, the present invention is not limited to this structure and even if they exist in the same n− semiconductor layer 106, the same effect can be obtained.

Furthermore, the structures of the nch-MOS transistor region 41 and the limiting resistance R2 region 15 are not limited to those shown in FIG. 24 and for example, as the limiting resistance, a base resistance, a gate resistance, a poly resistance or p+ iso resistance may be employed.

(Embodiment 17)

Figure 25:
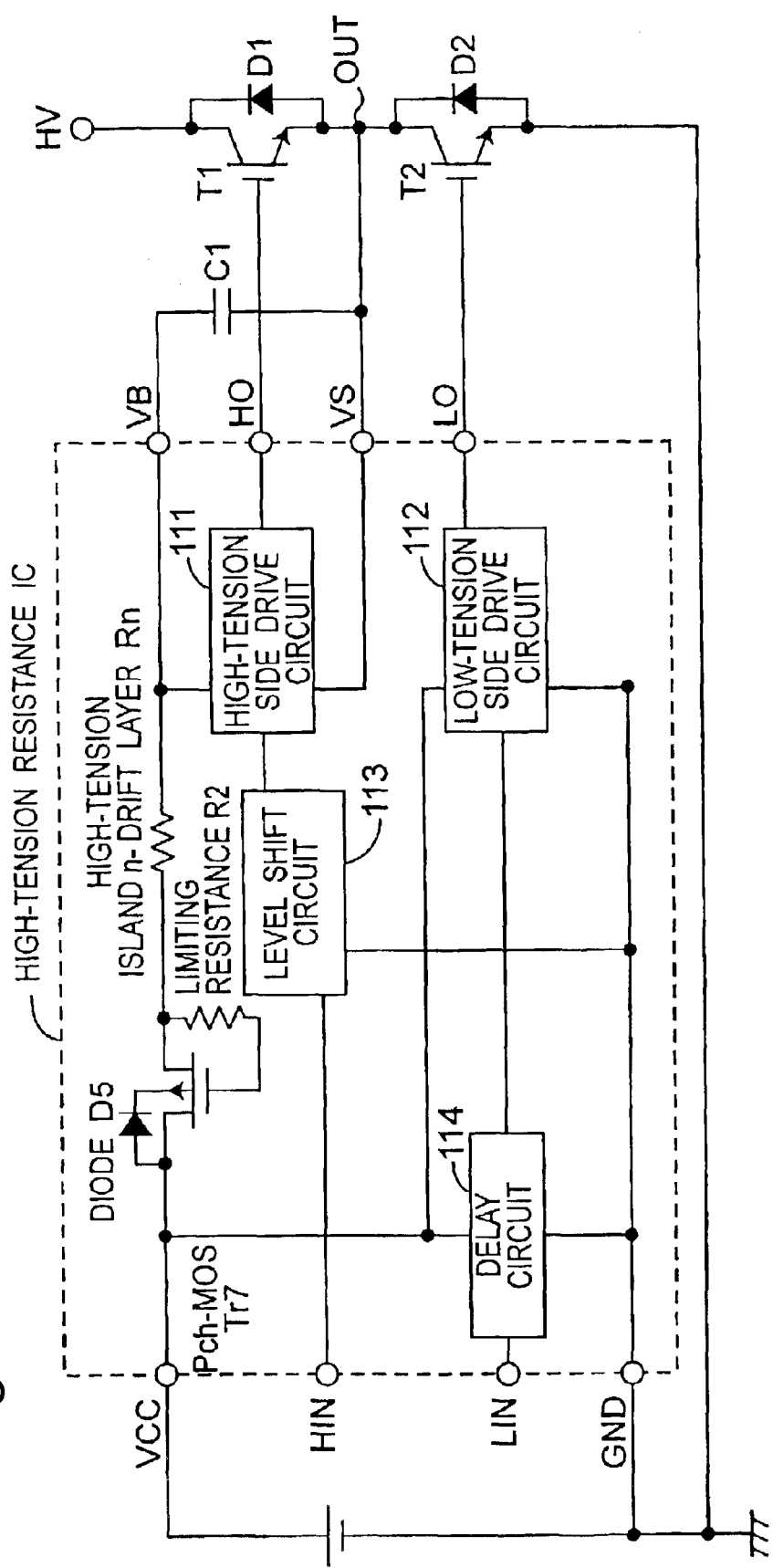
FIG. 25 is a schematic circuit view showing a structure of a semiconductor device connected with a power device according to Embodiment 17 of the present invention.
Figure 26:
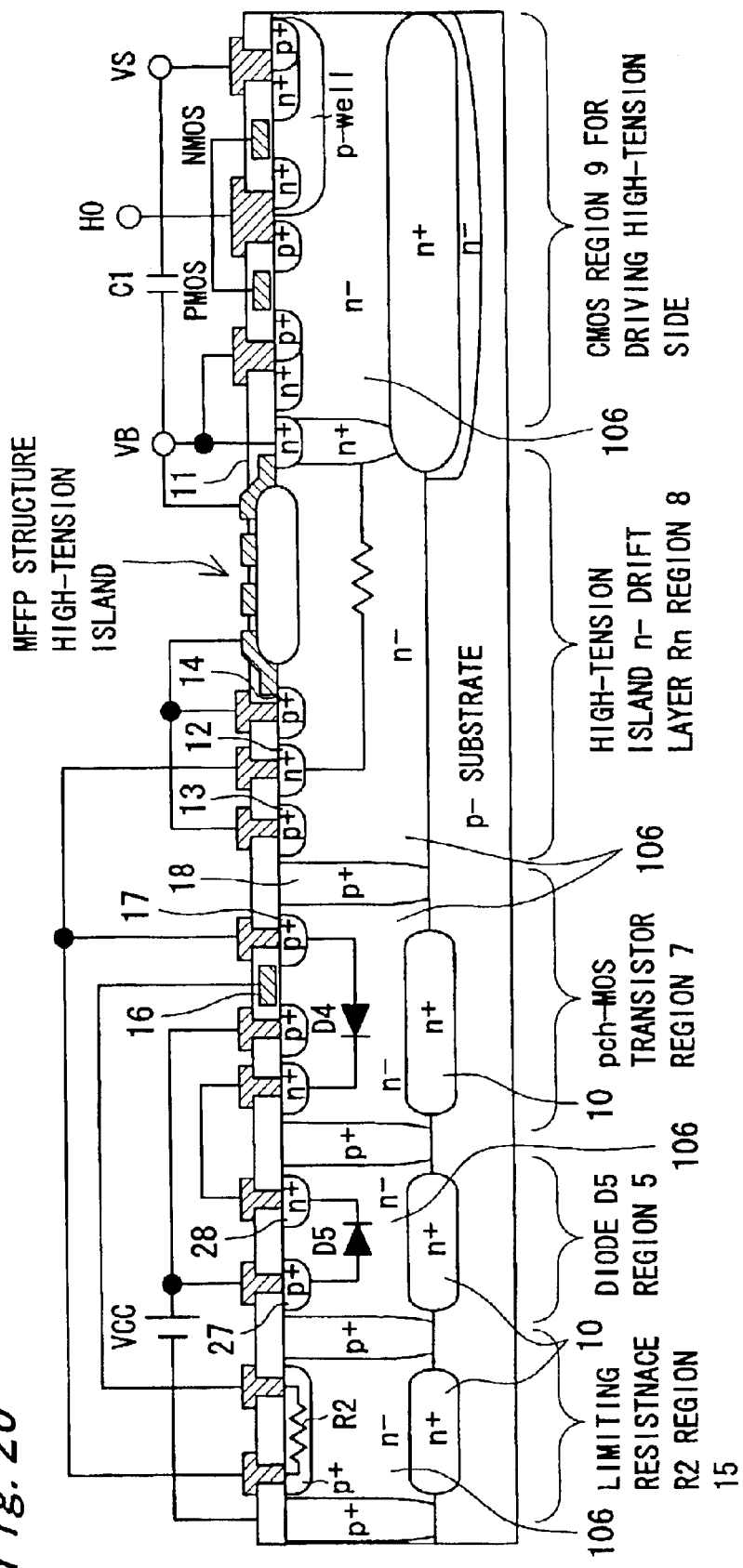
FIG. 26 is a sectional view showing an essential part of a bootstrap circuit of the semiconductor device according to Embodiment 17 of the present invention.

Embodiment 17 of the present invention is described with reference to FIGS. 25 and 26. FIG. 25 shows a schematic circuit structure according to Embodiment 17 of the present invention in which a semiconductor device and a power device are connected. FIG. 26 shows a sectional structure of an essential part of a bootstrap circuit according to Embodiment 17 of the present invention. Its basic structure is substantially the same as that of Embodiment 16 shown in FIGS. 23 and 24.

Embodiment 17 is different from Embodiment 16 in that a limiting resistance R2 region 15 is connected between a gate and a second p+ layer 17 of the pch-MOS transistor region 7 and the gate of the pch-MOS transistor region 7 is connected to only one terminal of the limiting resistance R2 region 15.

As shown in FIGS. 25 and 26, according to a bootstrap system in which the limiting resistance R2 region 15 is mounted on an IC chip with a high-tension resistance, the gate of the pch-MOS transistor region 7 is connected to the second p+ layer 17 of the pch-MOS transistor region 7 through the limiting resistance R2. Meanwhile, one terminal of the external capacitor C1 connected between a VB terminal and a VS terminal is connected to the power-supply voltage Vcc of, for example, 15V through the n− drift layer Rn and through the pch-MOS transistor region 7 on the IC chip with a high-tension resistance.

In the case where an output terminal OUT is maintained at the ground potential while a lower transistor T2 is in a conducting (ON) state, a potential of the VB terminal is thereby determined. When the potential of the VB terminal is Vcc or less, the pch-MOS transistor region 7 turns on and a charging current is applied to the external capacitor C1, whereby the external capacitor C1 maintains a charged voltage V2 which is lower than the power-supply voltage Vcc by a threshold value of the pch-MOS transistor region 7. Thus, a drive circuit 112 on the low-tension side is driven by a relatively low power-supply voltage Vcc and a drive circuit 111 on the high-tension side is driven by the voltage V2 charged in the external capacitor C1.

Thus, when the pch-MOS transistor region 7 is in the ON state, the charged voltage V2 which is lower than the power-supply voltage Vcc by the threshold value of the pch-MOS transistor region 7 can be maintained by the capacitor C1 connected between the terminals VB and VS. Accordingly, the ON operation of a parasitic transistor can be prevented much better than in the prior art and the bootstrap circuit can be mounted on the monolithic IC chip.

In addition, when the pch-MOS transistor region 7 is in the OFF state, the charged current can be prevented from flowing out through the body drain diode D4. Furthermore, when an output element (i.e., T1) on the high-tension side in a power converter is in the ON state, the pch-MOS transistor region 7 can be prevented from turning on in the opposite direction to the charging direction.

Still further, since it is not necessary to synchronize timing of the ON operation of the transistor T2 on the low-tension side of the output element in the power converter (power device) with the pch-MOS transistor region 7, it is not necessary to provide a drive circuit such as an nch-MOS transistor region 41 for driving the pch-MOS transistor region 7, and it is not necessary to provide a delay circuit was necessary for synchronizing the timing of the ON operation of the transistor T2 on the low-tension side of the output element of the power converter with the pch-MOS transistor region 7, whereby a circuit area can be considerably reduced.

In addition, it is apparent that only the structure of a chargeable semiconductor device portion in Embodiment 17 of the present invention is different from that in Embodiment 16. Therefore, this embodiment 17 can be applied to Embodiments 2 to 8 having different structures of the n– drift layer Rn region 8 of the high-tension island although their illustrations are omitted.

As for the structure of the diode D5 region 5, other than the structure shown in FIG. 26, the feature of the diode D5 region 5 according to this embodiment 17 can be applied to the structure of the diode D3 described in Embodiments 9 to 12 of the present invention although their illustrations are omitted. In addition, as for structure of the pch-MOS transistor region 7, other than the structure shown in FIG. 26, the feature of the pch-MOS transistor region 7 according to this embodiment 17 can be applied to the pch-MOS transistor region 7 described in Embodiment 14 although its illustration is not shown.

Furthermore, according to the structure shown in FIG. 26, although the junctions of the limiting resistance R2 region 15, pch-MOS transistor region 7 and diode D5 region 5 are isolated, the present invention is not limited to this structure and even if they exist in the same n– semiconductor layer 106, the same effect can be obtained. Furthermore, the structure of the limiting resistance R2 region 15 is not limited to that shown in FIG. 24 and for example, a base resistance, a gate resistance, a poly resistance or p+ iso resistance may be employed as the limiting resistance.

As described above, according to the present invention, since the base ion concentration is increased by adding the buried n+ layer and roles of maintaining the high tension and charging are separately performed by the different devices by isolating the junction, the operation of a parasitic transistor can be eliminated as much as possible and the ON operation of the parasitic transistor can be prevented, whereby a current consumption of the circuits can be reduced.

What is claimed is:

1. A semiconductor device for driving a power device comprising a bootstrap circuit which drives a power element on a low-tension side of the power device and supplies a power supply voltage for a high-tension drive side to a bootstrap capacitor connected between a floating supply absolute voltage terminal of the high-tension drive side and a floating supply offset voltage terminal of the high-tension drive side, said bootstrap circuit comprising at least a chargeable semiconductor element region and a high-tension maintaining potion, wherein junction between said chargeable semiconductor element portion and said high-tension maintaining portion is isolated and said high-tension maintaining portion is comprised of an n– drift layer having n+ layers provided at a high-tension side and at an opening portion in an n– semiconductor layer of a high-tension island.

2. A semiconductor device according to claim 1, wherein a buried n+ layer is intervened between the n– semiconductor layer and a p– substrate in the chargeable semiconductor element region in said bootstrap circuit.

3. A semiconductor device according to claim 1, wherein said n– drift layer is provided with a pair of p+ layers having the same potential as that of the p– substrate, on the both sides of the n+ layer of said opening portion of the high-tension island.

4. A semiconductor device according to claim 3, wherein in said n– drift layer, one of the pair of p+ layers provided on both sides of the n+ layer of the opening portion of the high-tension island is a p+ diffusion layer which isolates the junction of said chargeable semiconductor element portion and said high-tension maintaining portion and said p+ diffusion layer is partially in contact with the p– substrate.

5. A semiconductor device according to claim 3, wherein in said n– drift layer, at least one of the p+ layers provided on both sides of the n+ layer of said opening portion of the high-tension island, other than the p+ diffusion layer for isolating the junction, is covered with a p– well.

6. A semiconductor device according to claim 1, wherein in said n– drift layer, a p+ layer having the same potential as that of the p– substrate is provided immediately below the n+ layer of said opening portion of the high-tension island so that the p+ layer is intervened between said n– semiconductor layer and said p– substrate.

7. A semiconductor device according to claim 1, wherein said bootstrap circuit is provided on a monolithic IC of a high-tension resistance.

8. A semiconductor device according to claim 1, wherein said chargeable semiconductor element portion of said bootstrap circuit includes at least a diode region, an anode of said diode region is connected to a power-supply voltage, and a cathode of said diode region is connected to a floating supply absolute voltage terminal of the high-tension side through said n– drift layer.

9. A semiconductor device according to claim 8, wherein said diode region comprises a p+ layer and an n+ layer in said n– semiconductor layer and a buried n+ layer is intervened between said n– semiconductor layer and said p– substrate, the p+ layer of said diode region is connected to a power-supply voltage and the n+ layer of said diode region is connected to the n+ layer of said high-tension island opening portion.

10. A semiconductor device according to claim 8, wherein in said diode region (D3, 6), a p− well is provided in said n− semiconductor layer, the p+ layer and the n+ layer are provided within said p− well, the buried n+ layer is intervened between said n− semiconductor layer and said p-substrate, the p+ layer of said diode is connected to the power-supply voltage and the n+ layer of said diode is connected to the n+ layer of said opening portion of the high-tension island.

11. A semiconductor device according to claim 10, wherein in said diode region, an n+ layer is further provided in said n− semiconductor layer and the n+ layer in said n− semiconductor layer is connected to the p+ layer in said p− well.

12. A semiconductor device according to claim 1, wherein the chargeable semiconductor element portion of said bootstrap circuit includes at least a pch-MOS transistor, a first p+ layer of said pch-MOS transistor is connected to a power-supply voltage and a second p+ layer of said pch-MOS transistor is connected to the floating supply absolute voltage terminal of the high-tension side through said n− drift layer.

13. A semiconductor device according to claim 12, wherein a low-tension diode is provided between the first p+ layer of said pch-MOS transistor and a backgate of said pch-MOS transistor, in the opposite direction to a reverse recovery current which flows through a body drain diode when said pch-MOS transistor is switched off.

14. A semiconductor device according to claim 12, wherein timing of driving said pch-MOS transistor is synchronized with timing of driving said power element of said low-tension side.

15. A semiconductor device according to claim 12, wherein the n+ layer of said opening portion of the high-tension island in said n− drift layer (8) is connected to the second p+ layer of said pch-MOS transistor region, said second p+ layer is connected to the gate of said pch-MOS transistor region through a limiting resistance, the gate of said pch-MOS transistor is connected to a drain of an nch-MOS transistor, and wherein timing of driving said nch-MOS transistor is synchronized with timing of driving said power element of the low-tension side.

16. A semiconductor device according to claim 12, wherein the n+ layer of said opening portion of the high-tension island in said n− drift layer is connected to the second p+ layer of said pch-MOS transistor region and said second p+ layer is connected to the gate of said pch-MOS transistor region through the limiting resistance, and the gate of said pch-MOS transistor is not connected to anything except for said limiting resistance.

17. A semiconductor device according to claim 9, wherein the n+ layer provided in said n− semiconductor layer is partially in contact with a buried n+ layer in the chargeable semiconductor element portion of said bootstrap circuit.

* * * * *